United States Patent
Tsai et al.

(10) Patent No.: US 12,476,198 B2
(45) Date of Patent: Nov. 18, 2025

(54) PACKAGE STRUCTURE WITH ADHESIVE ELEMENT OVER SEMICONDUCTOR CHIP

(71) Applicant: Taiwan Semiconductor Manufacturing Company, Ltd., Hsinchu (TW)

(72) Inventors: Po-Hao Tsai, Zhongli (TW); Techi Wong, Zhubei (TW); Yi-Wen Wu, New Taipei (TW); Po-Yao Chuang, Hsin-Chu (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 80 days.

(21) Appl. No.: 18/177,921

(22) Filed: Mar. 3, 2023

(65) Prior Publication Data
US 2023/0207476 A1 Jun. 29, 2023

Related U.S. Application Data

(63) Continuation of application No. 16/452,830, filed on Jun. 26, 2019, now Pat. No. 11,600,573.

(51) Int. Cl.
*H01L 23/538* (2006.01)
*H01L 21/56* (2006.01)
(Continued)

(52) U.S. Cl.
CPC ........ *H01L 23/5389* (2013.01); *H01L 21/568* (2013.01); *H01L 23/3128* (2013.01);
(Continued)

(58) Field of Classification Search
CPC . H01L 23/3128; H01L 23/31; H01L 23/3107; H01L 23/3114; H01L 23/3135; H01L 23/3142; H01L 2023/4018
See application file for complete search history.

(56) References Cited

U.S. PATENT DOCUMENTS 9,000,584 B2 4/2015 Lin et al.
9,048,222 B2 6/2015 Hung et al.
(Continued)

FOREIGN PATENT DOCUMENTS

CN 106560918 A 4/2017
CN 109216219 A 1/2019

OTHER PUBLICATIONS

Chinese language office action dated Sep. 4, 2020, issued in application No. TW 109105262.
(Continued)

*Primary Examiner* — William B Partridge
*Assistant Examiner* — Gustavo G Ramallo
(74) *Attorney, Agent, or Firm* — McClure, Qualey & Rodack, LLP

(57) ABSTRACT

A package structure is provided. The package structure includes a redistribution structure and a semiconductor chip over the redistribution structure. The package structure also includes an adhesive element over the semiconductor chip. Opposite outermost edges of the adhesive element are laterally between opposite outermost edges of the redistribution structure. The package structure further includes a protective layer laterally surrounding the semiconductor chip and the adhesive element. In addition, the package structure includes a thermal conductive element over the semiconductor chip. The thermal conductive element is surrounded by the adhesive element.

20 Claims, 31 Drawing Sheets

(51) Int. Cl.
*H01L 23/00* (2006.01)
*H01L 23/31* (2006.01)

(52) U.S. Cl.
CPC .......... *H01L 23/5386* (2013.01); *H01L 24/16* (2013.01); *H01L 24/32* (2013.01); *H01L 24/73* (2013.01); *H01L 24/92* (2013.01); *H01L 2224/16225* (2013.01); *H01L 2224/32225* (2013.01); *H01L 2224/73253* (2013.01); *H01L 2224/92225* (2013.01)

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 11,456,257 B2 | 9/2022 | Jeng et al. | |
| 2001/0002321 A1* | 5/2001 | Castro | H01L 24/97 438/122 |
| 2002/0047216 A1 | 4/2002 | Jiang et al. | |
| 2002/0172021 A1 | 11/2002 | Seri et al. | |
| 2005/0109455 A1 | 5/2005 | Bai | |
| 2005/0194698 A1 | 9/2005 | Shim et al. | |
| 2006/0065972 A1* | 3/2006 | Khan | H01L 23/13 257/E23.079 |
| 2006/0220259 A1* | 10/2006 | Chen | H01L 21/568 257/E21.503 |
| 2006/0273467 A1* | 12/2006 | Brandenburg | H01L 21/565 257/788 |
| 2006/0289972 A1* | 12/2006 | Nishimura | H01L 24/17 257/E21.511 |
| 2007/0075435 A1* | 4/2007 | Suminoe | H01L 23/49816 257/E23.021 |
| 2008/0179718 A1* | 7/2008 | Wu | H01L 21/56 257/659 |
| 2009/0236686 A1 | 9/2009 | Shim et al. | |
| 2009/0289364 A1* | 11/2009 | Sakamoto | H01L 23/3114 257/E23.072 |
| 2010/0044856 A1 | 2/2010 | Sri-Jayantha et al. | |
| 2010/0171209 A1 | 7/2010 | Tanie et al. | |
| 2010/0237495 A1 | 9/2010 | Pagaila et al. | |
| 2012/0086122 A1* | 4/2012 | Cheng | H01L 24/13 257/E23.072 |
| 2012/0168938 A1* | 7/2012 | Gan | H01L 21/561 257/737 |
| 2012/0280404 A1 | 11/2012 | Kwon et al. | |
| 2013/0233607 A1 | 9/2013 | Nakamura et al. | |
| 2013/0256857 A1* | 10/2013 | Gruber | H01L 23/3135 257/E23.116 |
| 2014/0049930 A1 | 2/2014 | Yamaguchi et al. | |
| 2014/0151863 A1* | 6/2014 | Kim | H01L 23/49816 257/672 |
| 2014/0217610 A1 | 8/2014 | Jeng et al. | |
| 2015/0179570 A1* | 6/2015 | Marimuthu | H01L 24/97 438/126 |
| 2015/0221601 A1 | 8/2015 | Kim et al. | |
| 2015/0221625 A1 | 8/2015 | Chun et al. | |
| 2015/0303174 A1 | 10/2015 | Yu et al. | |
| 2016/0260695 A1 | 9/2016 | Chung et al. | |
| 2017/0077053 A1* | 3/2017 | Keser | H01L 24/46 |
| 2017/0098628 A1 | 4/2017 | Liu et al. | |
| 2017/0358517 A1 | 12/2017 | Matsubara | |
| 2017/0358535 A1 | 12/2017 | Yoo et al. | |
| 2018/0342475 A1 | 11/2018 | Wirz et al. | |
| 2019/0131241 A1 | 5/2019 | Jeng et al. | |
| 2019/0189564 A1 | 6/2019 | Guzek | |
| 2021/0118835 A1* | 4/2021 | Wu | H01L 23/5385 |

OTHER PUBLICATIONS

Chinese language office action dated Jul. 22, 2022, issued in application No. CN 202010080526.0.

\* cited by examiner

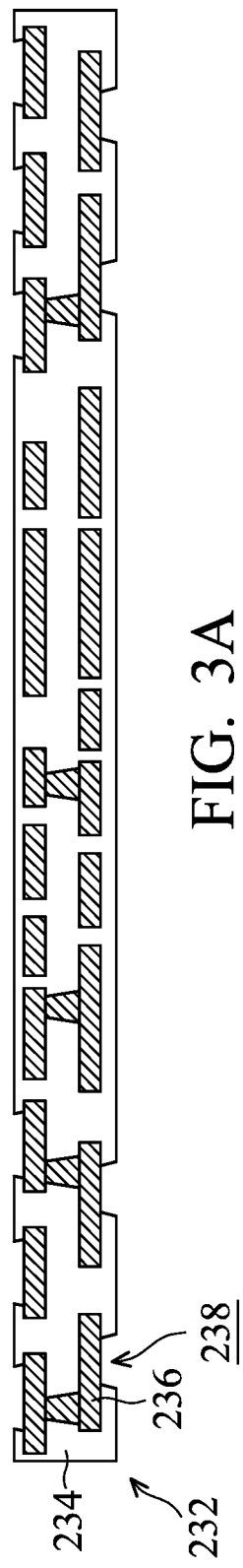 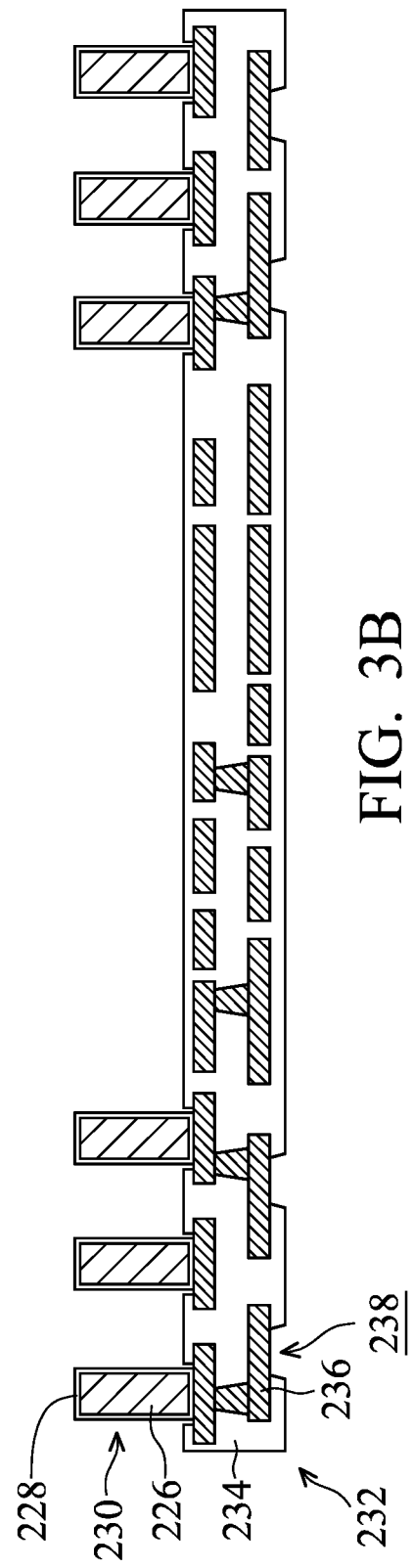

PACKAGE STRUCTURE WITH ADHESIVE ELEMENT OVER SEMICONDUCTOR CHIP

This Application is a Continuation application of U.S. patent application Ser. No. 16/452,830, filed on Jun. 26, 2019, the entirety of which is incorporated by reference herein.

BACKGROUND

The semiconductor integrated circuit (IC) industry has experienced rapid growth.

Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which utilize less area or are lower in height, have been developed to package the semiconductor devices.

New packaging technologies have been developed to further improve the density and functionalities of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 3A-3C are cross-sectional views of various stages of a process for forming an interposer substrate of a package structure, in accordance with some embodiments.

DETAILED DESCRIPTION

Figure 1A:
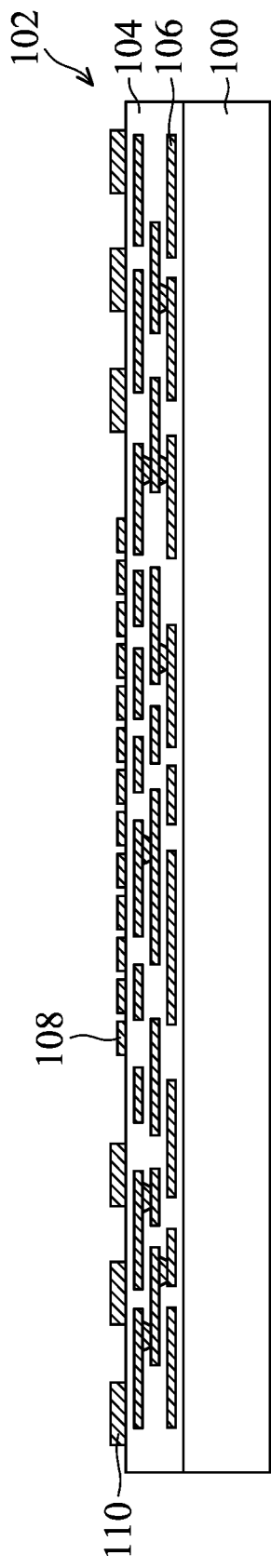
FIGS. 1A-1J are cross-sectional views of various stages of a process for forming a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to 3D packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1J are cross-sectional views of various stages of a process for forming a package structure, in accordance with some embodiments. As shown in FIG. 1A, a redistribution structure 102 is formed over a carrier substrate 100, in accordance with some embodiments. The carrier substrate 100 may be a glass substrate, a semiconductor substrate, or another suitable substrate. The redistribution structure 102 may be used for routing. The redistribution structure 102 includes multiple insulating layers 104 and multiple conductive features 106 surrounded by the insulating layers 104. The conductive features 106 may include conductive lines, conductive vias, and/or conductive pads.

The redistribution structure 102 also includes conductive elements 108 and 110 that are used to hold or receive other elements. In some embodiments, the conductive elements 108 and 110 are exposed at or protrude from the topmost surface of the insulating layers 104. The conductive elements 108 may be used to hold or receive one or more semiconductor dies. The conductive elements 110 may be used to hold or receive conductive features such as conductive pillars and/or conductive balls.

The insulating layers 104 may be made of or include one or more polymer materials. The polymer material(s) may include polybenzoxazole (PBO), polyimide (PI), epoxy-based resin, one or more other suitable polymer materials, or a combination thereof. In some embodiments, the polymer material is photosensitive. A photolithography process may therefore be used to form openings with desired patterns in the insulating layers 104.

In some other embodiments, some or all of the insulating layers 104 are made of or include dielectric materials other than polymer materials. The dielectric material may include silicon oxide, silicon carbide, silicon nitride, silicon oxynitride, one or more other suitable materials, or a combination thereof.

The conductive features 106 may include conductive lines providing electrical connection in horizontal directions and conductive vias providing electrical connection in vertical directions. The conductive features 106 may be made of or include copper, aluminum, gold, cobalt, titanium, nickel, silver, graphene, one or more other suitable conductive materials, or a combination thereof. In some embodiments, the conductive features 106 include multiple sub-layers. For example, each of the conductive features 106 contains multiple sub-layers including Ti/Cu, TiN/Cu, Ti/Cu/Ti, Al/Ti/Ni/Ag, other suitable sub-layers, or a combination thereof.

The formation of the redistribution structure 102 may involve multiple deposition or coating processes, multiple patterning processes, and/or multiple planarization processes.

The deposition or coating processes may be used to form insulating layers and/or conductive layers. The deposition or coating processes may include a spin coating process, an electroplating process, an electroless process, a chemical vapor deposition (CVD) process, a physical vapor deposition (PVD) process, an atomic layer deposition (ALD) process, one or more other applicable processes, or a combination thereof.

The patterning processes may be used to pattern the formed insulating layers and/or the formed conductive layers. The patterning processes may include a photolithography process, an energy beam drilling process (such as a laser beam drilling process, an ion beam drilling process, or an electron beam drilling process), an etching process, a mechanical drilling process, one or more other applicable processes, or a combination thereof.

The planarization processes may be used to provide the formed insulating layers and/or the formed conductive layers with planar top surfaces to facilitate subsequent processes. The planarization processes may include a mechanical grinding process, a chemical mechanical polishing (CMP) process, one or more other applicable processes, or a combination thereof.

Figure 1B:
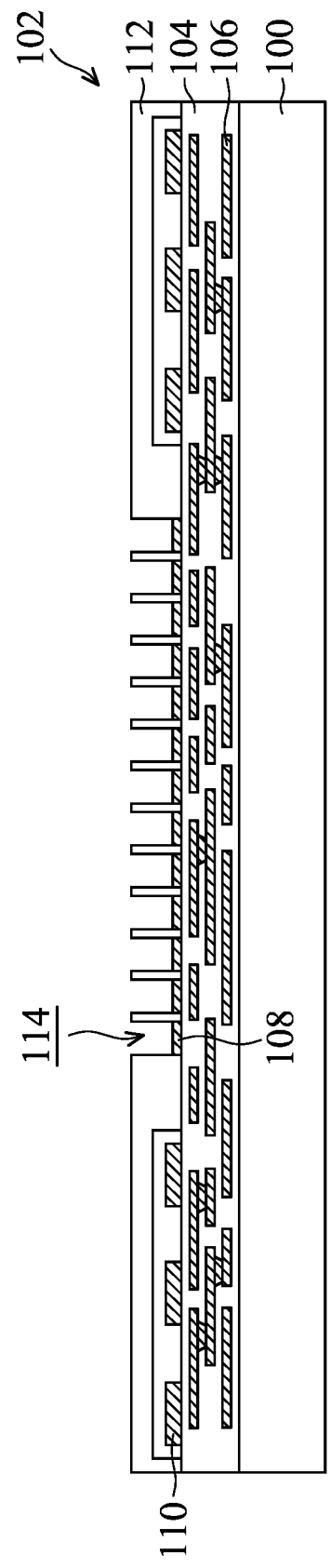

As shown in FIG. 1B, a mask element 112 is placed over the redistribution structure 102, in accordance with some embodiments. The mask element 112 may be a stencil with multiple openings 114. Each of the openings 114 exposes one of the conductive elements 108.

Figure 1C:
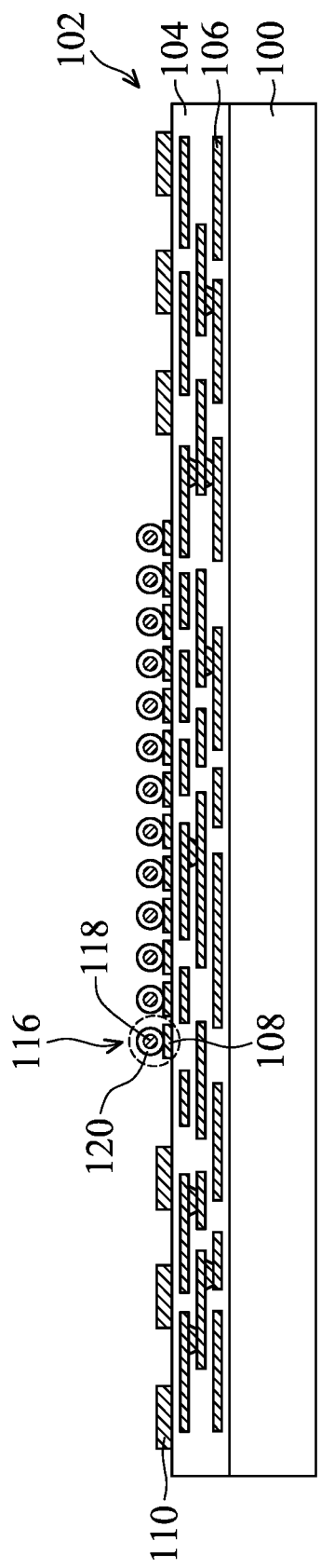

Afterwards, multiple conductive structures are spread on the mask element 112. Each of the conductive structures includes an inner element that is coated with an outer element. The inner element may be made of a metal material, and the outer element may be made of a solder material. Some of the conductive features enter the openings 114 to be in contact with the conductive elements 108 exposed by the openings 114. The mask element 112 is then removed. As a result, these conductive structures remaining on the conductive elements 108 form multiple conductive bumps 116, as shown in FIG. 1C in accordance with some embodiments. In some embodiments, a flux material is applied on the conductive elements 108 before the conductive structures are spread on the mask element 112. The flux material may help to attach the conductive bumps 116 on the conductive elements 108. In some embodiments, the conductive bumps 116 are disposed on the conductive elements 108 using the printing process illustrated in FIGS. 1B-1C. However, embodiments of the disclosure are not limited thereto. The conductive bumps 116 may be formed or disposed using other processes. In some other embodiments, each of the conductive bumps 116 is picked and placed on the corresponding conductive element 108.

Figure 6B:
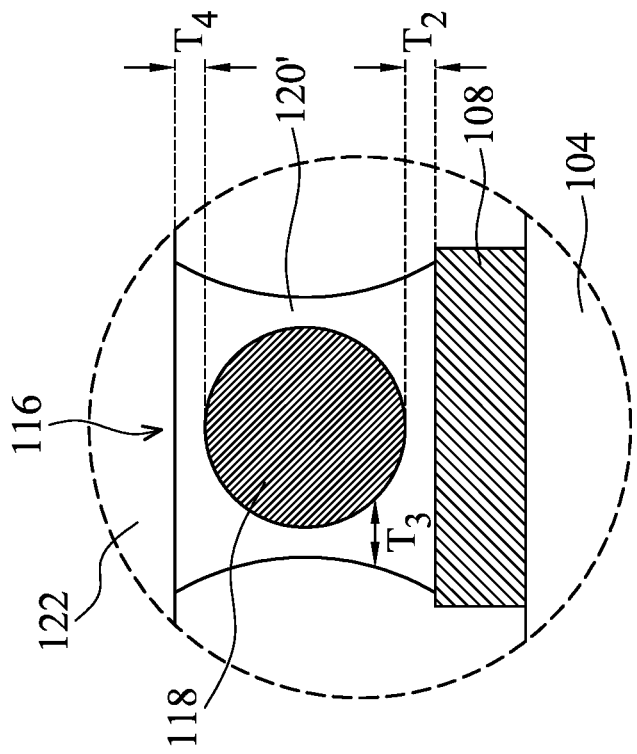
FIGS. 6A-6B are cross-sectional views of various stages of a process for forming a conductive bump of a package structure, in accordance with some embodiments.
Figure 6A:
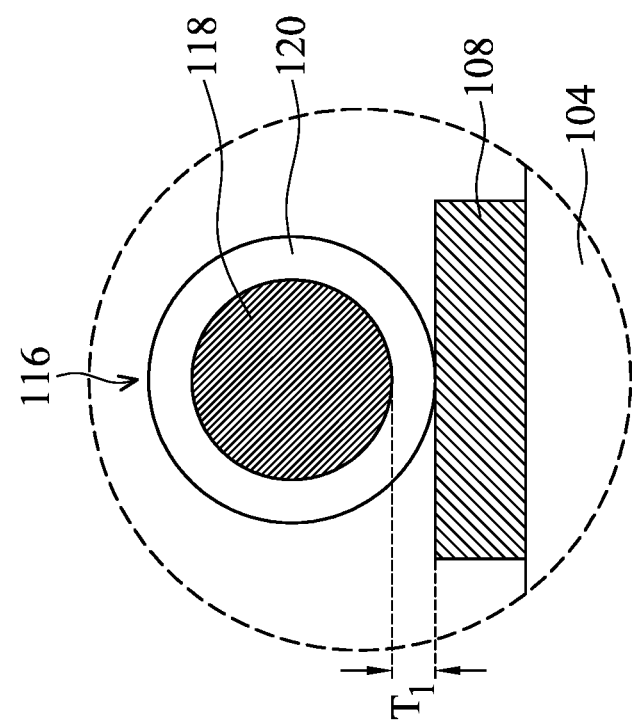

FIG. 6A is a cross-sectional view of an intermediate stage of a process for forming a conductive bump of a package structure, in accordance with some embodiments. In some embodiments, FIG. 6A shows an enlarged view of one of the conductive bumps 116 shown in FIG. 1C (such as the conductive bump 116 surrounded by the dotted circle). In some embodiments, each of the conductive bumps 116 includes a support element 118 and a solder element 120. In some embodiments, the solder element 120 extends along surfaces of the support element 118. In some embodiments, the solder element 120 extends conformally along surfaces of the support element 118. In some embodiments, the solder element 120 covers the entirety of the support element 118. The solder element 120 forms a shell surrounding the support element 118. In some embodiments, the solder element 120 has a substantially uniform thickness $T_1$, as shown in FIG. 6A.

In some embodiments, the support element 118 has a higher melting point than that of the solder element 120. In some embodiments, the support element 118 is made of a conductive material. The conductive material may include copper, aluminum, gold, platinum, one or more other suitable materials, or a combination thereof. For example, the support element 118 is a metal ball. In some embodiments, the metal ball has a diameter that is in a range from about 10 µm to about 60 µm. In some other embodiments, the metal ball has a diameter that is in a range from about 30 µm to about 50 µm.

The solder element 120 is made of a solder material. In some embodiments, the solder material is a tin-containing material. The solder material may further include copper, silver, gold, aluminum, lead, one or more other suitable materials, or a combination thereof. In some other embodiments, the solder material is lead-free.

Figure 1D:
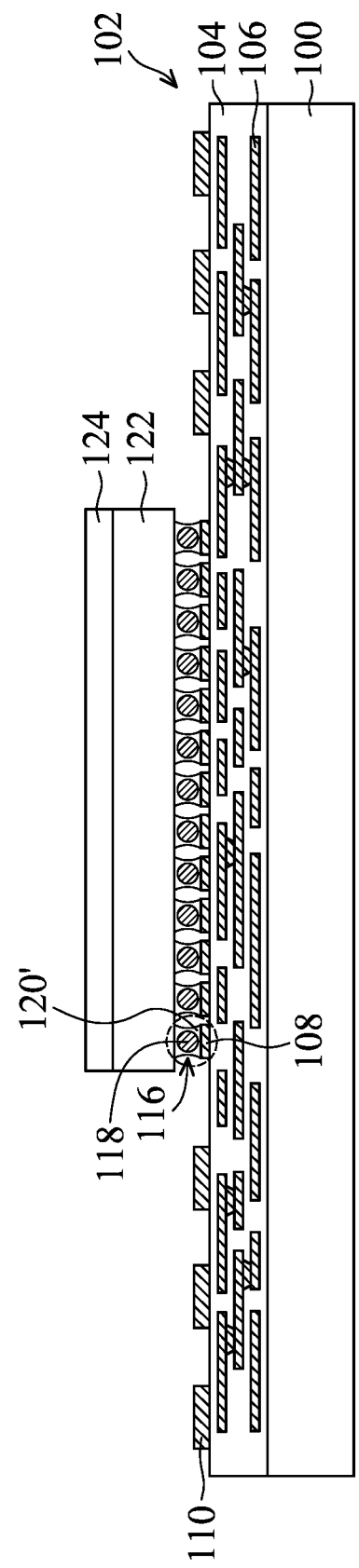

As shown in FIG. 1D, a semiconductor die 122 is placed over the redistribution structure 102, in accordance with some embodiments. In some embodiments, the semiconductor die 122 is bonded to the conductive bumps 116. In some embodiments, a thermal operation is used to reflow the conductive bumps 116 so as to affix the semiconductor die 122 onto the redistribution structure 102 through the conductive bumps 116. The thickness of the semiconductor die 122 may be in a range from about 50 µm to about 200 µm.

FIG. 6B is a cross-sectional view of an intermediate stage of a process for forming a conductive bump of a package structure, in accordance with some embodiments. In some embodiments, FIG. 6B shows an enlarged view of one of the conductive bumps 116 shown in FIG. 1D. In some embodiments, due to the thermal operation, the solder elements 120 become softer and are reflowed to form reflowed solder elements 120'. Each of the reflowed solder elements 120' has a different profile than that of the solder element 120. Different portions of the reflowed solder element 120' may have different thicknesses other than the thickness $T_1$ of the solder element 120.

As shown in FIGS. 1D and 6B, the reflowed solder element 120' has different thicknesses at different positions. As shown in FIG. 6B, the portion of the reflowed solder element 120' directly below a bottom point of the support element 118 has a thickness $T_2$. In some embodiments, the thickness $T_2$ is thinner than the thickness $T_1$ of the solder element 120 shown in FIG. 6A. The portion of the reflowed solder element 120' extending on the lower sidewall of the support element 118 has a thickness $T_3$, as shown in FIG. 6B. The portion of the reflowed solder element 120' extending on the upper sidewall of the support element 118 has a thickness $T_4$, as shown in FIG. 6B. In some embodiments, the thickness $T_3$ is thicker than the thickness $T_4$. In some embodiments, the thickness $T_3$ is thicker than the thickness $T_1$ of the solder element 120. In some embodiments, the thickness $T_4$ is thinner than the thickness $T_1$ of the solder element 120. In some other embodiments, the thickness $T_4$ is substantially equal to the thickness $T_1$ of the solder element 120.

As shown in FIG. 1D, an adhesive element 124 is formed on the semiconductor die 122, in accordance with some embodiments. The adhesive element 124 may include an adhesive tape, an adhesive film, adhesive glue, or another suitable element. For example, the adhesive element 124 is a die attach film (DAF). The adhesive element 124 may facilitate a subsequent bonding process between the semiconductor die 122 and an interposer substrate that will be stacked over the semiconductor die 122 later. The thickness of the adhesive element 124 may be in a range from about 10 µm to about 50 µm. In some other embodiments, one or more solder bumps are formed on the exposed area of the semiconductor die 122 (not shown in FIG. 1D). For example, the one or more solder bumps may be formed on portions of the lower surface of the semiconductor die 122 that are not occupied by the conductive bumps 116.

Figure 1E:
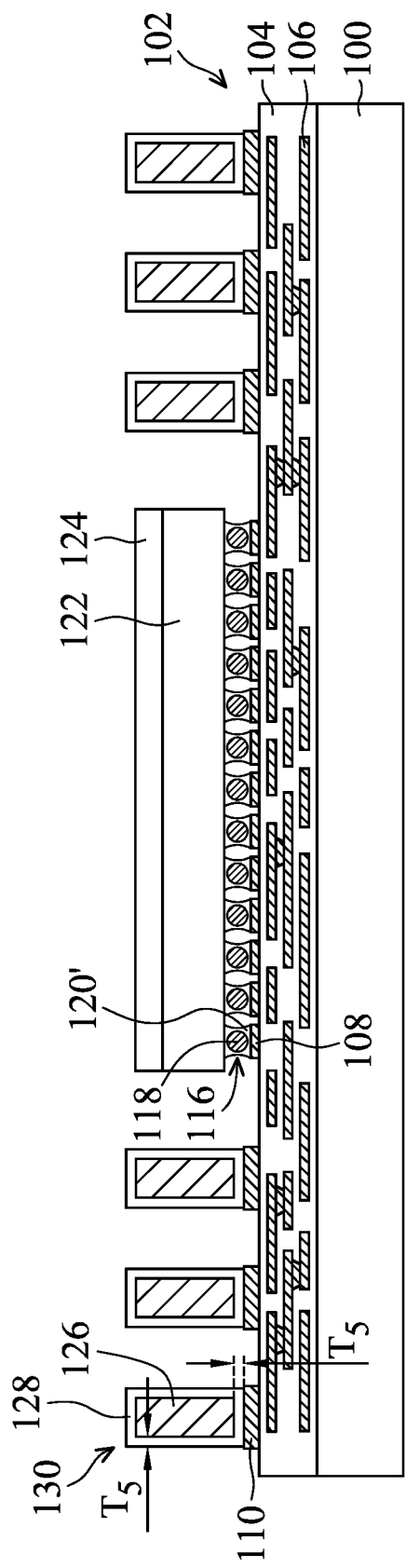

As shown in FIG. 1E, conductive features 130 are placed over the redistribution structure 102, in accordance with some embodiments. Each of the conductive features 130 is placed onto one of the conductive elements 110. In some embodiments, the conductive features 130 are picked and placed on the conductive elements 110. The height of one of the conductive features 130 may be in a range from about 60 µm to about 250 µm. The width of one of the conductive features 130 may be in a range from about 50 µm to about 200 µm.

Figure 8A:
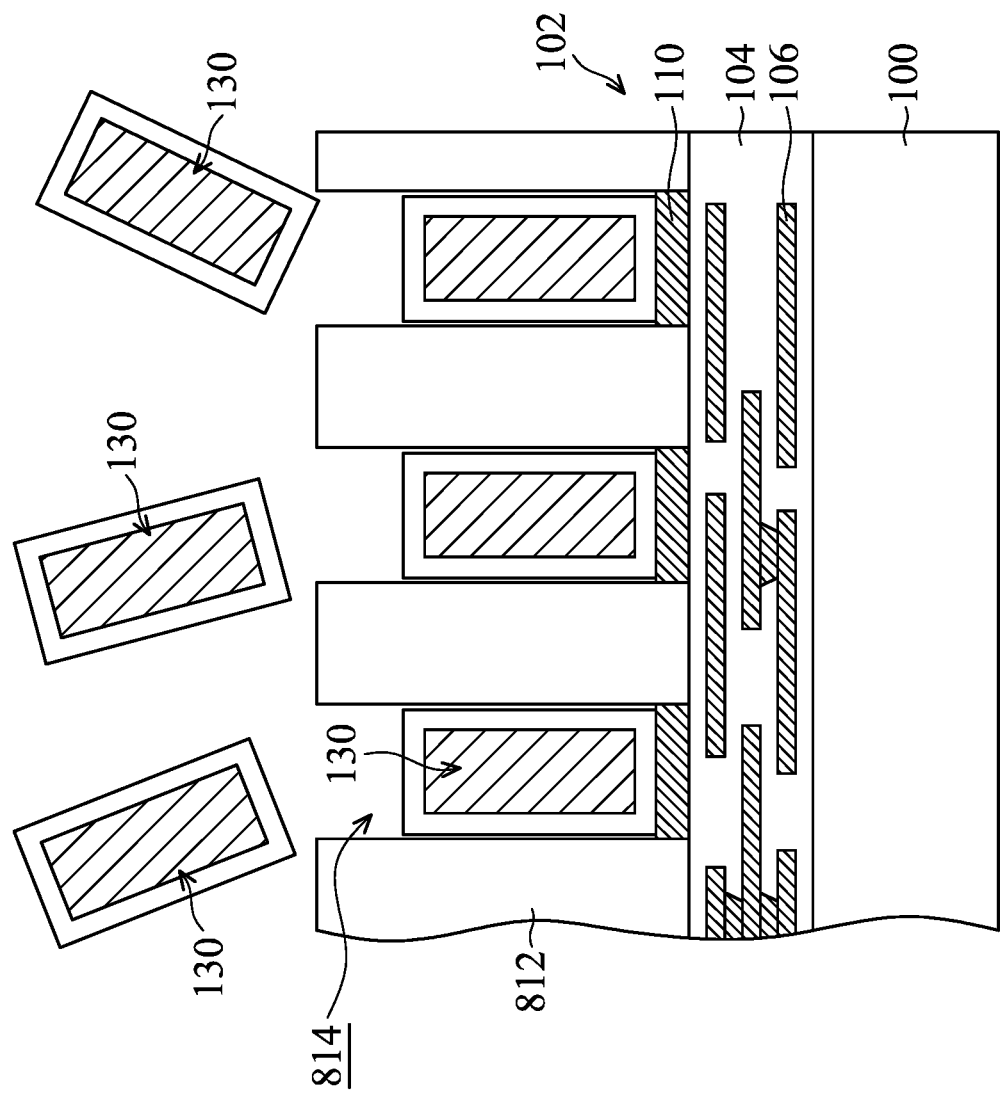
FIGS. 8A-8B are cross-sectional views of various stages of a process for forming conductive features of a package structure, in accordance with some embodiments.
Figure 8B:
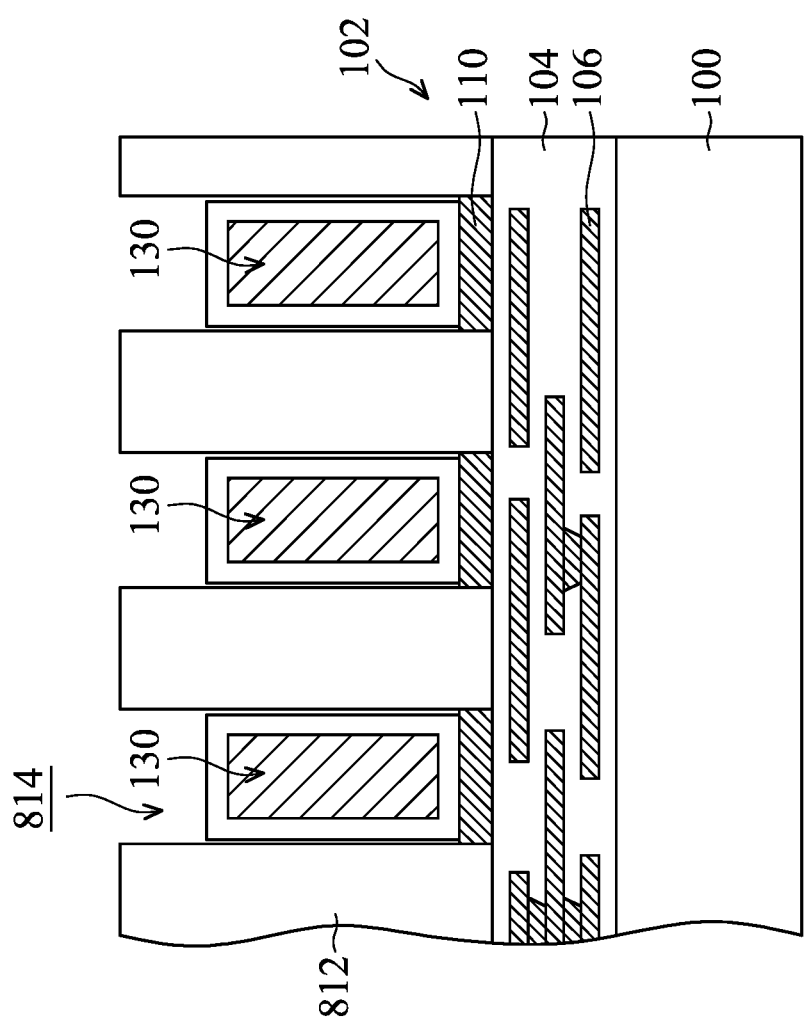

In some embodiments, similar to the embodiments shown in FIG. 1B, a printing process is used to form or dispose the conductive features 130. FIGS. 8A-8B are cross-sectional views of various stages of a process for forming conductive features of a package structure, in accordance with some embodiments.

As shown in FIG. 8A, a mask element 812 (such as a stencil) with multiple openings 814 is used to assist in the placing and/or printing of the conductive features 130. In some embodiments, multiple conductive features 130 are spread over the mask element 812. In some embodiments, the mask element 812 is vibrated to allow some of the conductive features 130 to fall into the openings 814 and to be in direct contact with the conductive elements 110. Afterwards, the conductive features 130 over the mask element 812 without falling into the openings 814 are removed. As a result, the structure shown in FIG. 8B is obtained. Afterwards, the mask element 812 is removed.

In some embodiments, a flux material is applied on the conductive elements 110 before the conductive features 130 are placed. The flux material may help to attach the conductive features 130 on the conductive elements 110.

In some embodiments, each of the conductive features 130 includes a support element 126 and a solder element 128, as shown in FIG. 1E. In some embodiments, the solder element 128 extends along surfaces of the support element 126. In some embodiments, the solder element 128 extends conformally along surfaces of the support element 126. In some embodiments, the solder element 128 covers the entirety of the support element 126. In some embodiments, the solder element 128 has a substantially uniform thickness $T_5$, as shown in FIG. 1E.

In some embodiments, the support element 126 has a higher melting point than that of the solder element 128. In some embodiments, the support element 126 is made of a conductive material. The conductive material may include copper, aluminum, gold, platinum, one or more other suitable materials, or a combination thereof. For example, the support element 126 is a metal pillar, as shown in FIG. 1E. In some embodiments, the metal pillar has a vertical sidewall. The vertical sidewall may be substantially perpendicular to a bottom surface of the redistribution structure 102.

The solder element 128 is made of a solder material. In some embodiments, the solder material is a tin-containing material. The solder material may further include copper, silver, gold, aluminum, lead, one or more other suitable materials, or a combination thereof. In some other embodiments, the solder material is lead-free.

Figure 1F:
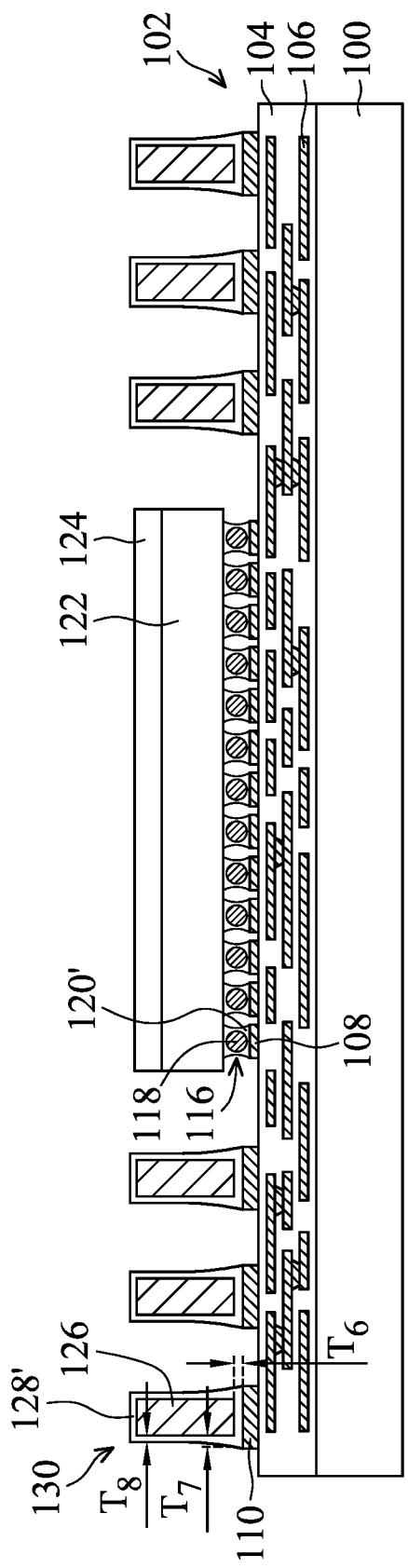

As shown in FIG. 1F, a thermal operation is used to reflow the conductive features 130 so as to enhance adhesion between the conductive features 130 and the conductive elements 110. In some embodiments, due to the thermal operation, the solder elements 128 become softer and are reflowed to form reflowed solder elements 128'. Each of the reflowed solder elements 128' has a different profile than that of the solder element 128 shown in FIG. 1E. Thicknesses of the reflowed solder elements 128' are changed when compared with the solder elements 128. Different portions of the reflowed solder element 128' may have different thicknesses other than the thickness $T_5$ of the solder element 128.

As shown in FIG. 1F, the reflowed solder element 128' has different thicknesses at different positions. As shown in FIG. 1F, the portion of the reflowed solder element 128' directly below the bottom surface of the support element 126 has a thickness $T_6$. In some embodiments, the thickness $T_6$ is thinner than the thickness $T_5$ of the solder element 128 shown in FIG. 1E. In some other embodiments, the thickness $T_6$ is substantially equal to the thickness $T_5$ of the solder element 128 shown in FIG. 1E. The portion of the reflowed solder element 128' extending on the lower sidewall of the support element 126 has a thickness $T_7$, as shown in FIG. 1F. The portion of the reflowed solder element 128' extending on the upper sidewall of the support element 126 has a thickness $T_8$, as shown in FIG. 1F. In some embodiments, the thickness $T_7$ is thicker than the thickness $T_8$. In some embodiments, the thickness $T_7$ is thicker than the thickness $T_5$ of the solder element 128. In some embodiments, the thickness $T_8$ is thinner than the thickness $T_5$ of the solder element 128.

Figure 1G:
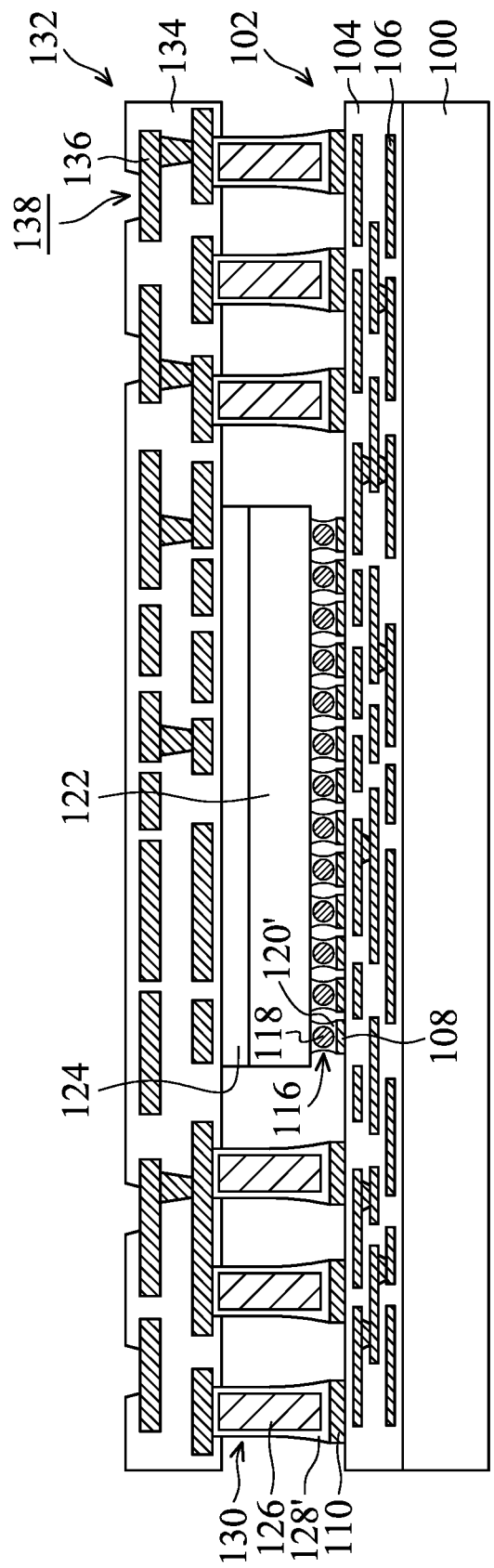

As shown in FIG. 1G, an interposer substrate 132 is stacked over the redistribution structure 102, in accordance with some embodiments. The interposer substrate 132 extends across the semiconductor die 122. In some embodiments, the interposer substrate 132 is bonded to the conductive features 130. In some embodiments, the interposer substrate 132 is bonded to the semiconductor die 122 through the adhesive element 124. The adhesive element 124 may be in direct contact with the interposer substrate 132. The adhesive element 124 facilitates the bonding between the semiconductor die 122 and the interposer substrate 132. The thickness of the interposer substrate 132 may be in a range from about 50 μm to about 300 μm.

In some embodiments, the interposer substrate 132 includes a board 134 and conductive elements 136. The board 134 includes openings 138 that expose some of the conductive elements 136. Other device elements such as surface mounted devices and/or other package modules may be stacked over the interposer substrate 132 and form electrical connections through some of the conductive elements 136 exposed by the openings 138. For example, a memory package module may be stacked on the interposer substrate 132.

The board 134 may be made of or include a polymer material, a ceramic material, a metal material, a semiconductor material, one or more other suitable materials, or a combination thereof. For example, the board 134 includes resin, prepreg, glass, and/or ceramic. In cases where the board 134 is made of a metal material or a semiconductor material, dielectric layers may be formed between the board 134 and the conductive elements 136 to prevent short circuiting.

In cases where the board 134 is made of or includes a polymer material, the board 134 may further include fillers that are dispersed in the polymer material. The polymer material may be made of or include epoxy-based resin, polyimide-based resin, one or more other suitable polymer materials, or a combination thereof. The examples of the fillers may include fibers (such as silica fibers and/or carbon-containing fibers), particles (such as silica particles and/or carbon-containing particles), or a combination thereof. In some embodiments, the board 134 has a greater weight percentage of fillers than that of the insulating layers 104 of the redistribution structure 102. In some embodiments, the insulating layers 104 of the redistribution structure 102 are made of or include a polymer material. In some embodiments, the insulating layers 104 of the redistribution structure 102 contain no fillers.

In some embodiments, the interposer substrate 132 is positioned to allow some of the conductive elements 136 to be aligned with the conductive features 130. In some other embodiments, one or more solder bumps are formed on the exposed area of some of the conductive elements 136 in the bottom side of the interposer substrate 132. (not shown in FIG. 1G). In some embodiments, a thermal reflow process is used to affix the interposer substrate 132 and the conductive features 130. In some embodiments, the interposer substrate 132 and the carrier substrate 100 are pressed against each other at an elevated temperature. As a result, the interposer substrate 132 is bonded to the conductive features 130. In some embodiments, a thermal compression process is used to achieve the bonding process mentioned above. In some embodiments, the elevated temperature is in a range from about 120 degrees C. to about 200 degrees C. In some other embodiments, the elevated temperature is in a range from about 150 degrees C. to about 180 degrees C.

Figure 1H:
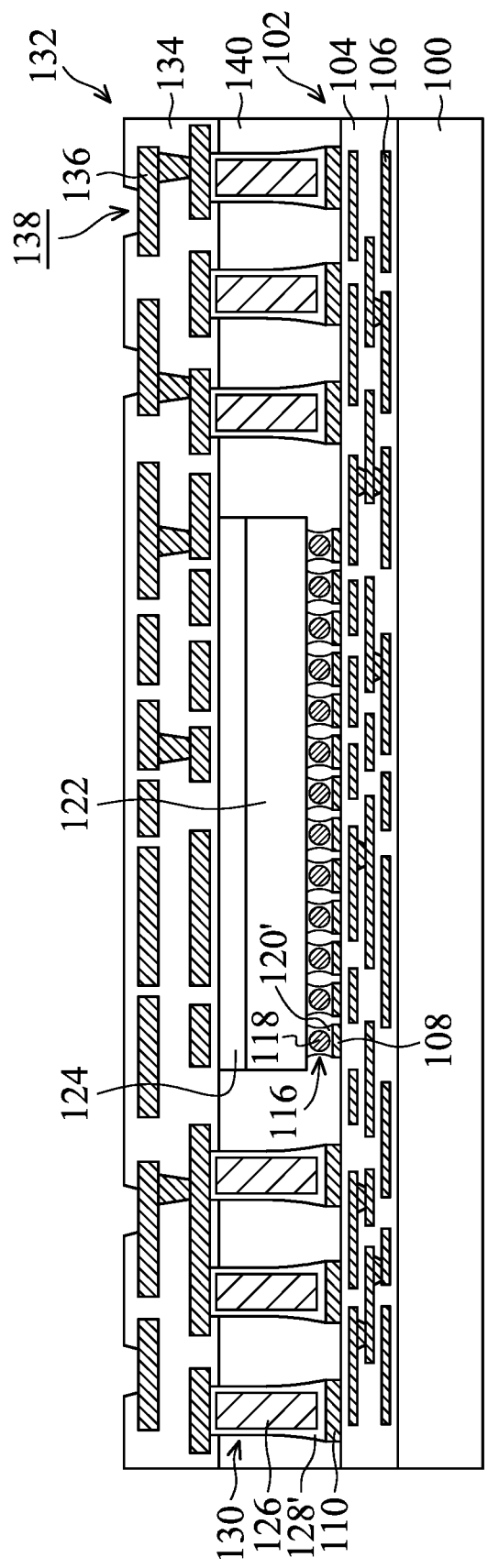

As shown in FIG. 1H, a protective layer 140 is formed to surround the conductive features 130 and the semiconductor die 122, in accordance with some embodiments. In some embodiments, the protective layer 140 is in direct contact with the conductive features 130. In some embodiments, the protective layer 140 is in direct contact with the reflowed solder elements 128'. For each of the conductive features 130, the reflowed solder element 128' is between the support element 126 and the protective layer 140. In some embodiments, the reflowed solder element 128' separates the support element 126 from the protective layer 140.

In some embodiments, the protective layer 140 is in direct contact with the semiconductor die 122. In some embodiments, the protective layer 140 is in direct contact with the conductive bumps 116 between the semiconductor die 122 and the redistribution structure 102. In some embodiments, the protective layer 140 is in direct contact with the reflowed solder elements 120'. For each of the conductive bumps 116, the reflowed solder element 120' is between the support element 118 and the protective layer 140. In some embodiments, the reflowed solder element 120' separates the support element 118 from the protective layer 140.

However, embodiments of the disclosure are not limited thereto. Many variations and/or modifications can be made to embodiments of the disclosure. In some other embodiments, an underfill material is formed to surround and protect the conductive bumps 116 before the formation of the protective layer 140. In these cases, the protective layer 140 is not in direct contact with the conductive bumps 116.

In some embodiments, the protective layer 140 is made of or includes an insulating material such as a molding material. The molding material may include a polymer material, such as an epoxy-based resin with fillers dispersed therein. In some embodiments, a molding material (such as a liquid molding material) is introduced or injected into the space between the interposer substrate 132 and the carrier substrate 100 to serve as a molding underfill (MUF).

In some embodiments, a thermal process is then used to cure the liquid molding material and to transform it into the protective layer 140. As mentioned above, because the support element 126 of the conductive feature 130 has a higher melting point than that of the reflowed solder element 128', the conductive feature 130 still maintains rigid during the thermal process. The distance between the interposer substrate 132 and the redistribution structure 102 is therefore kept substantially the same. Similarly, the distance between the semiconductor die 122 and the redistribution structure 102 is substantially maintained without being substantially changed due to the support elements 118 of the conductive bumps 116. The warpage of the interposer substrate 132 and the redistribution structure 102 is significantly reduced. Since the warpage of the interposer substrate 132 is reduced, voids are prevented from being formed between the interposer substrate 132 and the semiconductor die 122 and/or being formed between the interposer substrate 132 and the protective layer 140. The reliability and performance of the package structure are therefore improved.

Figure 1I:
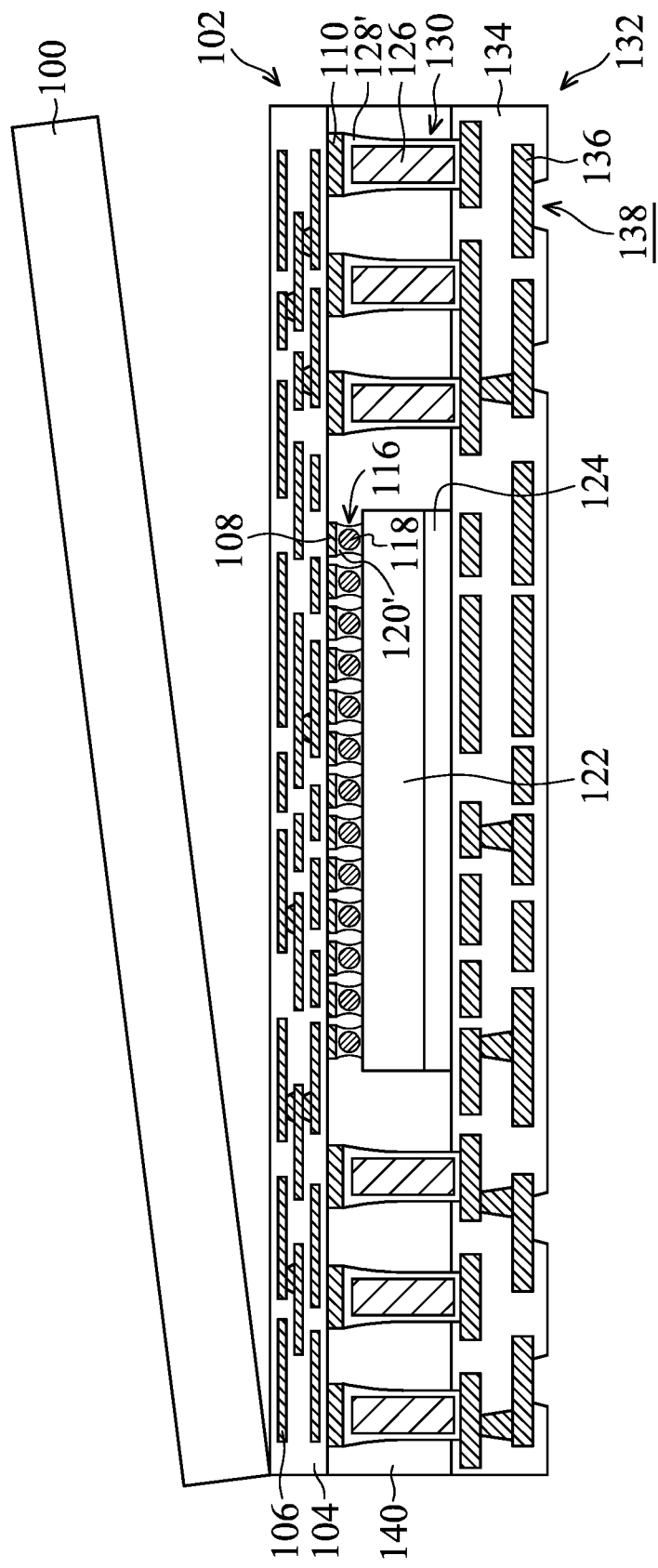

As shown in FIG. 1I, the structure shown in FIG. 1H is turned upside down, and the carrier substrate 100 is then removed, in accordance with some embodiments. In some embodiments, the structure shown in FIG. 1H is turned upside down and placed onto a tape carrier before the removal of the carrier substrate. In some embodiments, after the removal of the carrier substrate 100, some of the conductive features 106 are exposed.

Figure 1J:
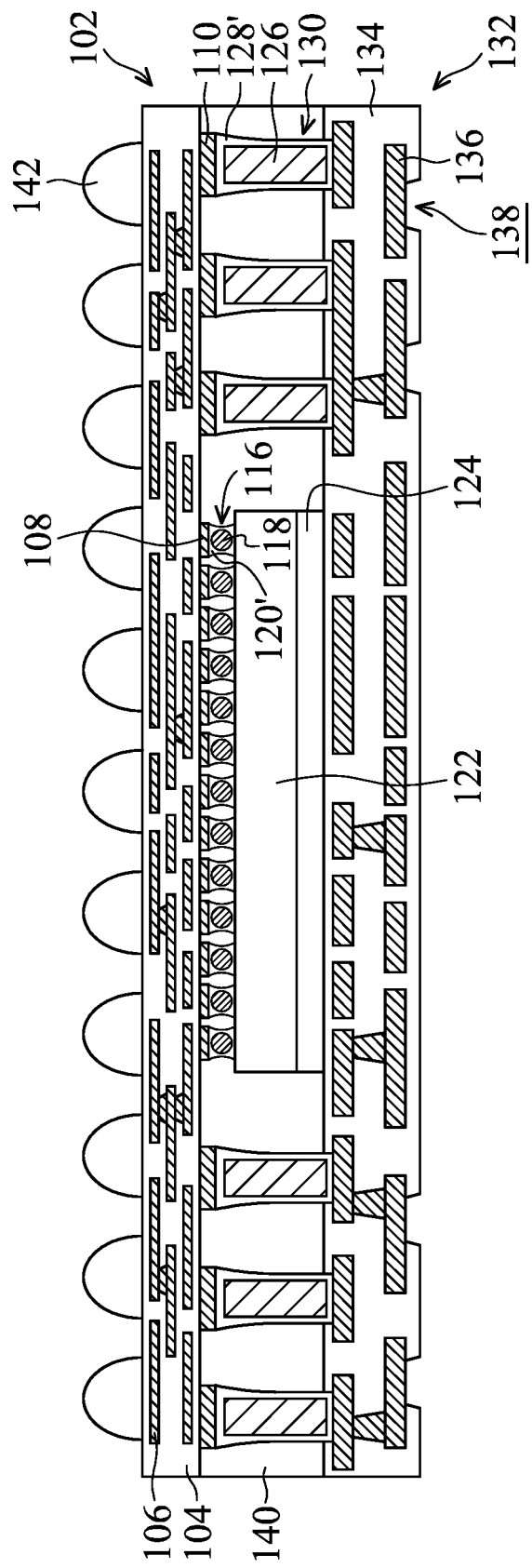

As shown in FIG. 1J, conductive bumps 142 are formed on the surface of the redistribution structure 102 that is originally covered by the carrier substrate 100, in accordance with some embodiments. In some embodiments, the conductive bumps 142 are or include solder bumps such as tin-containing solder bumps. The tin-containing solder bumps may further include copper, silver, gold, aluminum, lead, one or more other suitable materials, or a combination thereof. In some embodiments, the tin-containing solder bump is lead-free.

In some embodiments, solder balls (or solder elements) are disposed onto the exposed conductive features 106 after the removal of the carrier substrate 100. In some embodiments, the topmost insulating layer 104 is patterned to form openings that expose some of the conductive features 106 before the solder balls (or solder elements) are disposed. The openings may be formed using a photolithography process, an etching process, an energy beam drilling process, one or more other applicable processes, or a combination thereof. In some other embodiments, some of the conductive features 106 are formed at the surface of the redistribution structure 102. In these cases, once the carrier substrate 100 is removed as shown in FIG. 1I, some of the conductive features 106 are exposed. The topmost insulating layer 104 may not need to be patterned before the solder balls (or solder elements) are disposed.

A reflow process is then carrier out to melt the solder balls into the conductive bumps 142. In some other embodiments, under bump metallization (UBM) elements are formed over the exposed conductive features 106 before the solder balls are disposed. In some other embodiments, solder elements are electroplated onto the exposed conductive features 106. Afterwards, a reflow process is used to melt the solder element to form the conductive bumps 142. In some embodiments, a singulation process is then carrier out to saw through the formed structure. As a result, multiple separate package structures are formed. Afterwards, the tape carrier is removed. In FIG. 1J, one of the package structures is shown.

Many variations and/or modifications can be made to embodiments of the disclosure. FIGS. 2A-2F are cross-sectional views of various stages of a process for forming a package structure, in accordance with some embodiments.

Figure 2A:
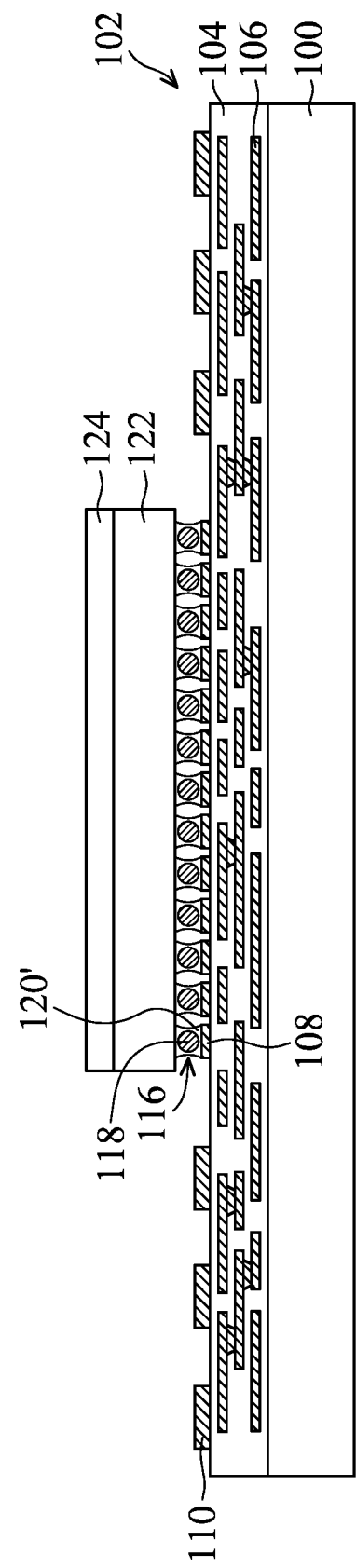
FIGS. 2A-2F are cross-sectional views of various stages of a process for forming a package structure, in accordance with some embodiments.
Figure 2B:
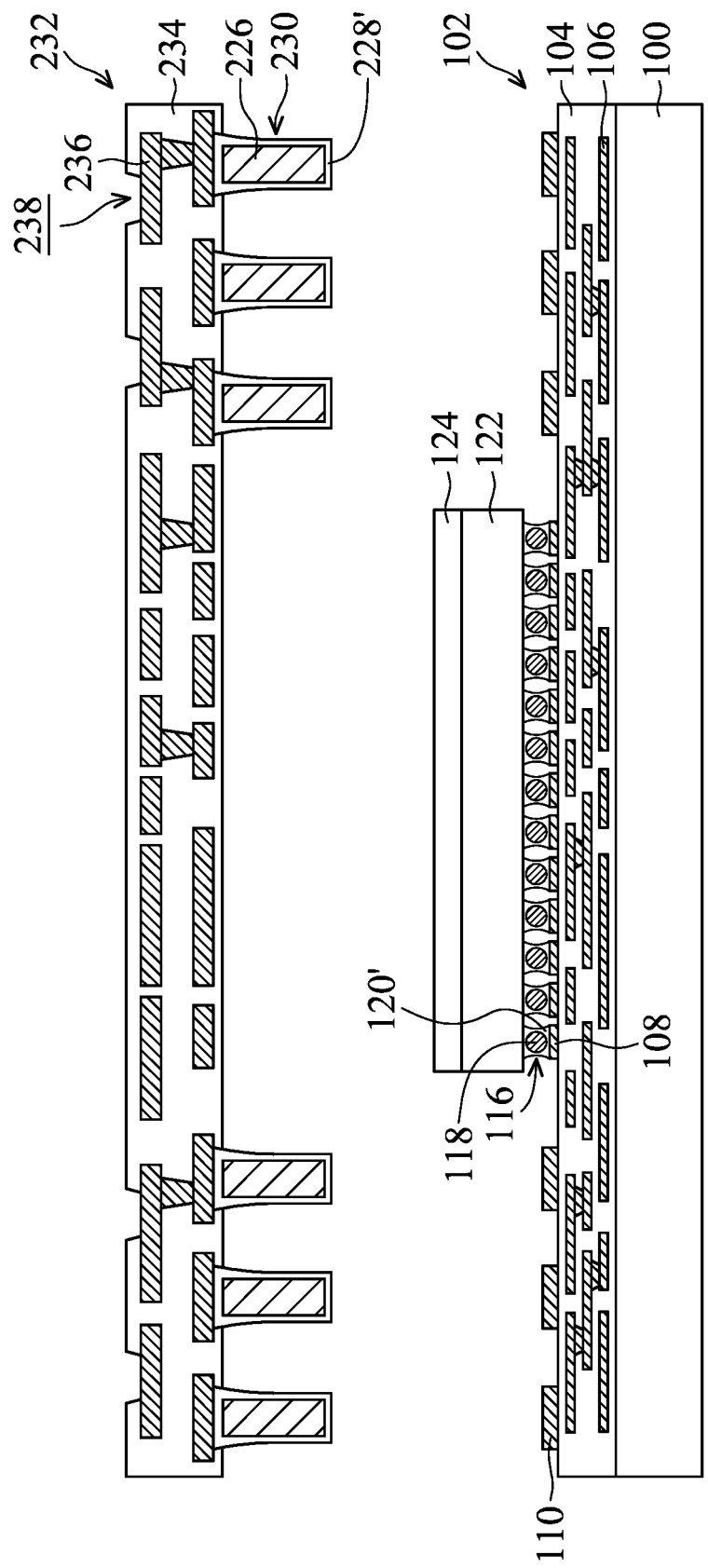

As shown in FIG. 2A, a structure the same as or similar to that shown in FIG. 1D is formed or received, in accordance with some embodiments. Afterwards, an interposer substrate 232 with conductive features 230 formed thereon is provided or received, as shown in FIG. 2B in accordance with some embodiments. The interposer substrate 232 is positioned above the redistribution structure 102 and is ready to be bonded onto the redistribution structure 102. The conductive features 230 are substantially aligned with the conductive elements 110, as shown in FIG. 2B.

Figure 3C:
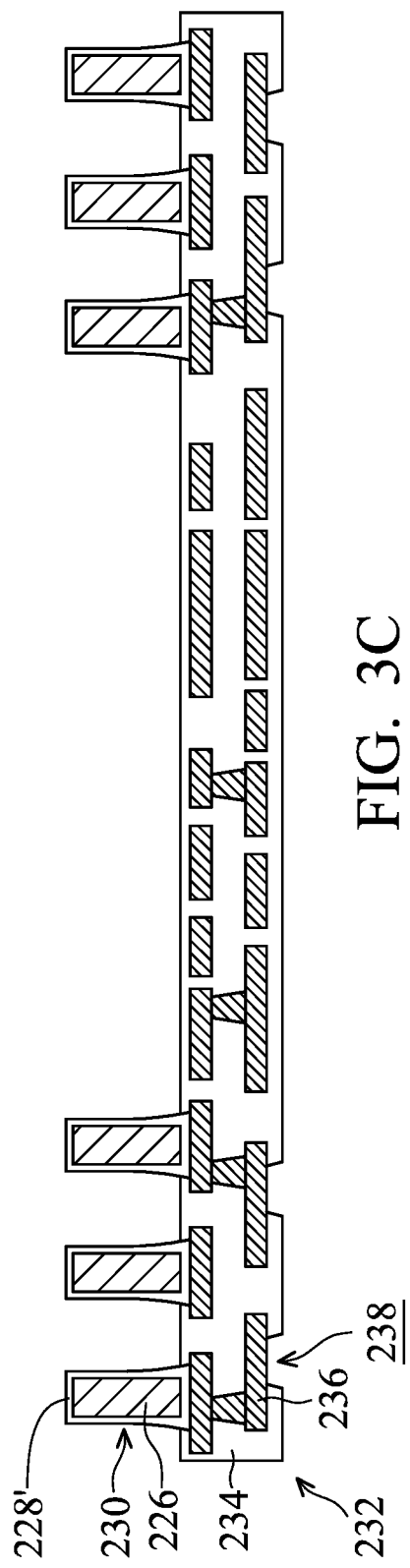

FIGS. 3A-3C are cross-sectional views of various stages of a process for forming an interposer substrate of a package structure, in accordance with some embodiments. In some embodiments, FIGS. 3A-3B are cross-sectional views of various stages of a process for forming the interposer substrate 232 with the conductive features 230 shown in FIG. 2B.

As shown in FIG. 3A, an interposer substrate 232 the same as or similar to the interposer substrate 132 shown in FIG. 1G is provided or received, in accordance with some embodiments. Similar to the interposer substrate 132, the interposer substrate 232 includes a board 234 and conductive elements 236. The board 234 includes openings 238 that expose some of the conductive elements 236. The material of the board 234 may be the same as or similar to that of the board 134. The interposer substrate 232 is turned so that the surface designed to be facing the redistribution structure 102 faces upwards. Some of the conductive elements 236 are exposed and are ready to receive subsequently disposed conductive features.

As shown in FIG. 3B, conductive features 230 are placed over the exposed conductive elements 236, in accordance with some embodiments. Each of the conductive features 230 is placed onto one of the conductive elements 236. In some embodiments, the conductive features 230 are picked and placed on the conductive elements 236. In some embodiments, similar to the embodiments shown in FIG. 1B, a mask element (such as a stencil) is used to assist in the placing of the conductive features 230. In some embodiments, a flux material is applied on the conductive elements 236 before the conductive features 230 are placed. The flux material may help to attach the conductive features 230 on the conductive elements 236.

In some embodiments, similar to the conductive features 130, each of the conductive features 230 includes a support element 226 and a solder element 228, as shown in FIG. 3B. In some embodiments, the solder element 228 extends along surfaces of the support element 226. In some embodiments, the solder element 228 extends conformally along surfaces of the support element 226. In some embodiments, the solder element 228 covers the entirety of the support element 226.

In some embodiments, the support element 226 has a higher melting point than that of the solder element 228. In some embodiments, the support element 226 is made of a conductive material. The conductive material may include copper, aluminum, gold, platinum, one or more other suitable materials, or a combination thereof. For example, the support element 226 is a metal pillar, as shown in FIG. 3B. In some embodiments, the metal pillar has a vertical sidewall. The vertical sidewall may be substantially perpendicular to a bottom surface of the interposer substrate 232.

The solder element 228 is made of a solder material. In some embodiments, the solder material is a tin-containing material. The solder material may further include copper, silver, gold, aluminum, lead, one or more other suitable materials, or a combination thereof. In some other embodiments, the solder material is lead-free.

As shown in FIG. 3C, a thermal operation is used to reflow the conductive features 230 so as to enhance adhesion between the conductive features 230 and the conductive elements 236. In some embodiments, due to the thermal operation, the solder elements 228 become softer and are reflowed to form reflowed solder elements 228'. Each of the reflowed solder elements 228' has a different profile than that of the solder element 228 shown in FIG. 3B. Thicknesses of the reflowed solder elements 228' are changed when compared with the solder elements 228. Different portions of the reflowed solder element 228' may have different thicknesses other than the thickness of the solder element 228. As shown in FIG. 3C, the reflowed solder element 228' has different thicknesses at different positions. The profile of the reflowed solder element 228' may be the same as or similar to that of the reflowed solder element 128' shown in FIG. 1F.

Figure 2C:
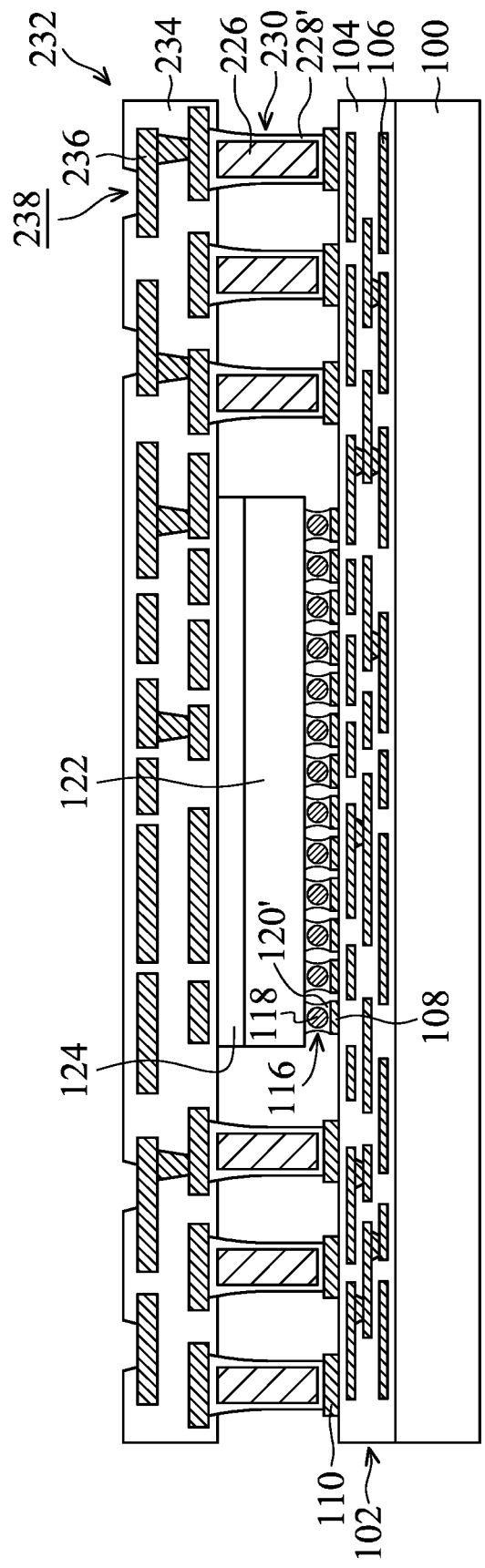

As shown in FIG. 2C, the interposer substrate 232 is stacked over the redistribution structure 102, in accordance with some embodiments. The interposer substrate 232 extends across the semiconductor die 122. In some embodiments, the interposer substrate 232 is bonded to the conductive elements 110 through the conductive features 230. In some embodiments, the interposer substrate 232 is attached onto the semiconductor die 122 through the adhesive element 124. The adhesive element 124 may be in direct contact with the interposer substrate 232.

In some embodiments, a thermal reflow process is used to affix the conductive features 230 and the conductive elements 110. In some embodiments, the interposer substrate 232 and the carrier substrate 100 are pressed against each other at an elevated temperature. As a result, the interposer substrate 232 is bonded to the redistribution structure 102 through the conductive features 230.

Figure 2D:
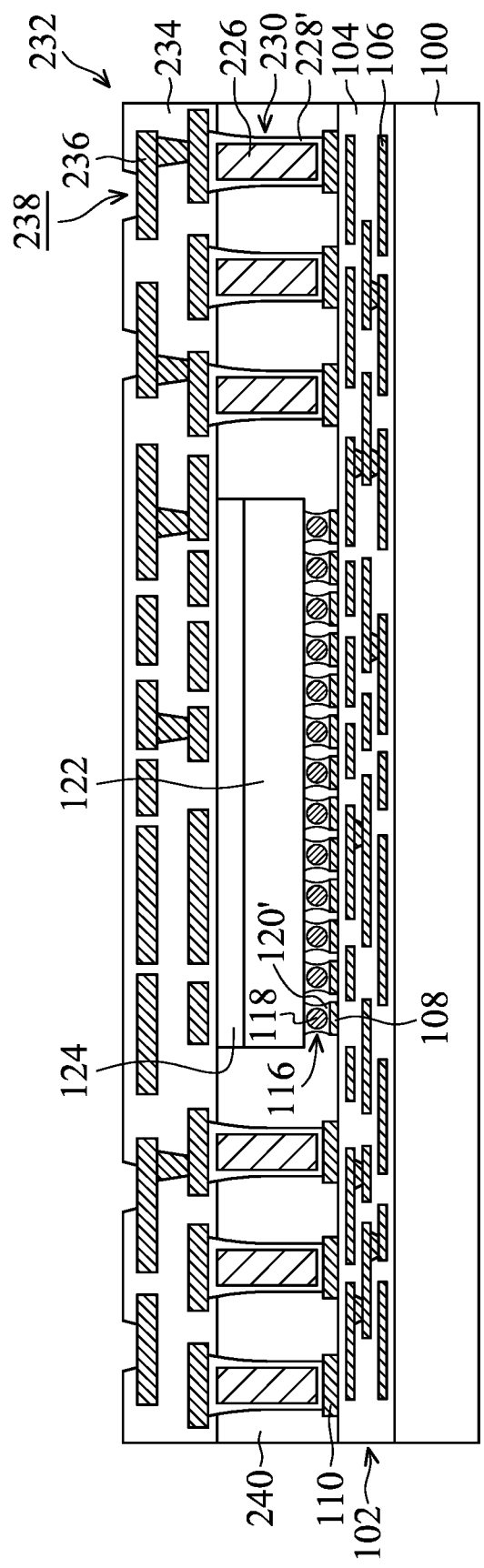

As shown in FIG. 2D, a protective layer 240 is formed to surround the conductive features 230 and the semiconductor die 122, in accordance with some embodiments. In some embodiments, the protective layer 240 is in direct contact with the conductive features 230. In some embodiments, the protective layer 240 is in direct contact with the reflowed solder elements 228'. For each of the conductive features 230, the reflowed solder element 128' is between the support element 226 and the protective layer 240. In some embodiments, the reflowed solder element 128' separates the support element 226 from the protective layer 240.

In some embodiments, the protective layer 240 is in direct contact with the semiconductor die 122. In some embodiments, the protective layer 240 is in direct contact with the conductive bumps 116 between the semiconductor die 122 and the redistribution structure 102. In some embodiments, the protective layer 240 is in direct contact with the reflowed solder elements 120'. For each of the conductive bumps 116, the reflowed solder element 120' is between the support element 118 and the protective layer 240. In some embodiments, the reflowed solder element 120' separates the support element 118 from the protective layer 240.

However, embodiments of the disclosure are not limited thereto. Many variations and/or modifications can be made to embodiments of the disclosure. In some other embodiments, an underfill material is formed to surround and protect the conductive bumps 116 before the formation of the protective layer 240. In these cases, the protective layer 240 is not in direct contact with the conductive bumps 116.

The material and formation method of the protective layer 240 may be the same as or similar to those of the protective layer 140 shown in FIG. 1H. In some embodiments, the formation of the protective layer 240 involves a thermal process. As mentioned above, because the support element 226 of the conductive feature 230 has a higher melting point than that of the reflowed solder element 228', the conductive feature 230 still maintains rigid during the thermal process. The distance between the interposer substrate 232 and the redistribution structure 102 is therefore kept substantially the same. Similarly, the distance between the semiconductor die 122 and the redistribution structure 102 is substantially maintained without being changed due to the support elements 118 of the conductive bumps 116. The warpage of the interposer substrate 232 and the redistribution structure 102 is significantly reduced. Since the warpage of the interposer substrate 232 is reduced, voids are prevented from being formed between the interposer substrate 232 and the semiconductor die 122 and/or being formed between the interposer substrate 232 and the protective layer 240. The reliability and performance of the package structure are therefore improved.

Figure 2E:
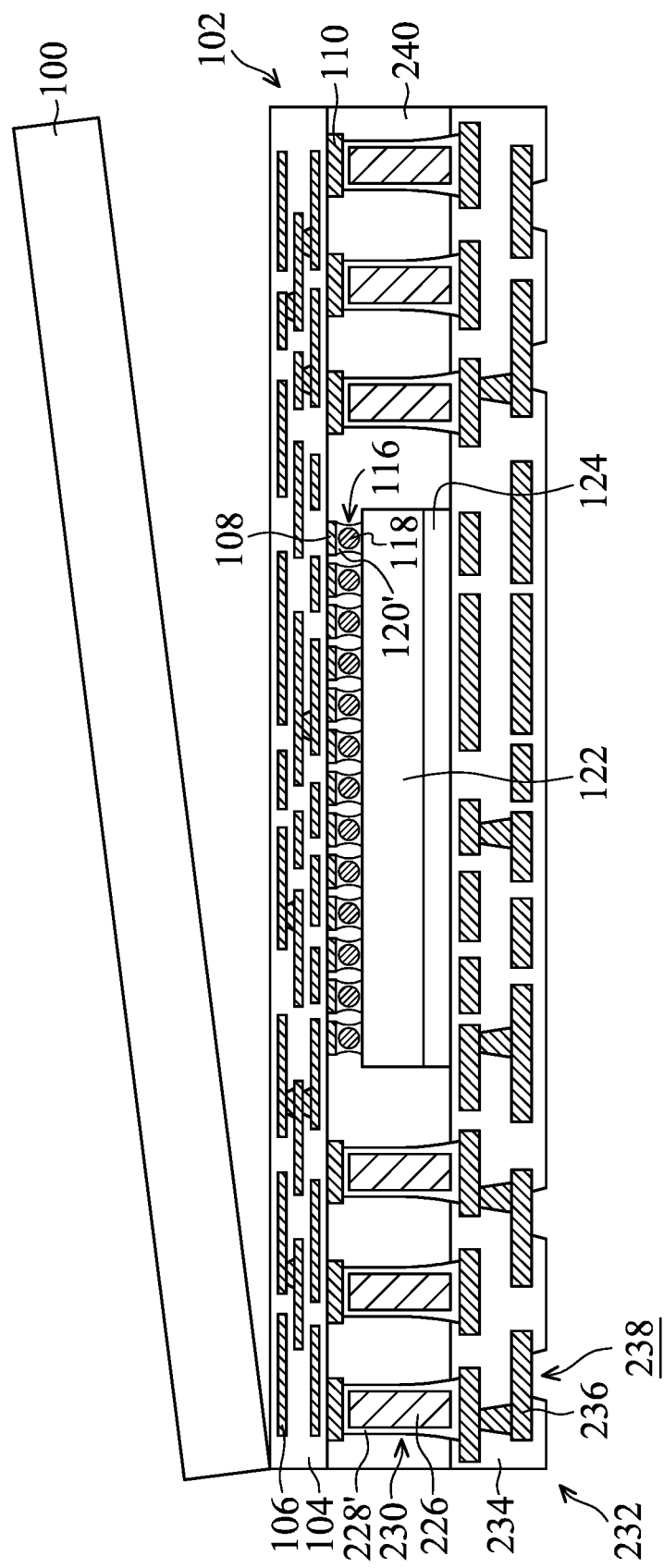

As shown in FIG. 2E, the structure shown in FIG. 2D is turned upside down, and the carrier substrate 100 is then removed, in accordance with some embodiments. In some embodiments, after the removal of the carrier substrate 100, some of the conductive features 106 are exposed.

Figure 2F:
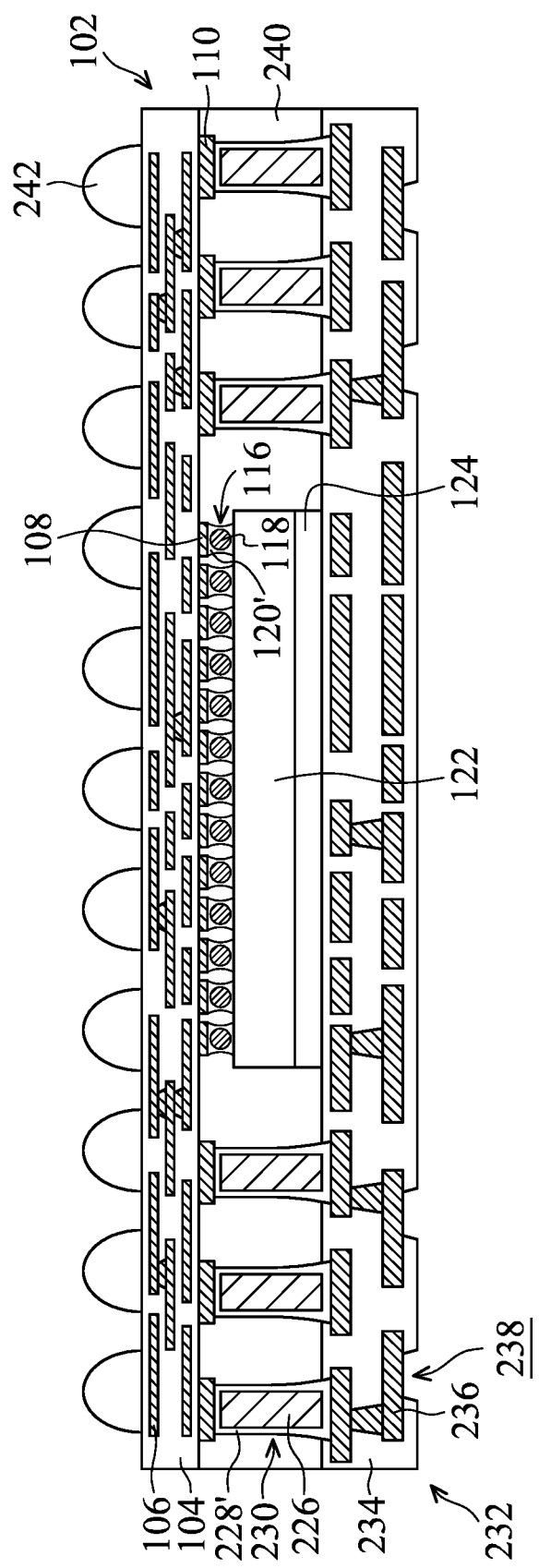

As shown in FIG. 2F, conductive bumps 242 are formed on the surface of the redistribution structure 102 that is originally covered by the carrier substrate 100, in accordance with some embodiments. The material and formation method of the conductive bumps 242 may be the same as or similar to those of the conductive bumps 142.

In some embodiments, a singulation process is then carrier out to saw through the formed structure. As a result, multiple separate package structures are formed. Afterwards, the tape carrier is removed. In FIG. 2F, one of the package structures is shown.

Many variations and/or modifications can be made to embodiments of the disclosure. In some embodiments, one or more thermal conductive elements are integrated into a package structure to further improve the performance of the package structure.

Figure 4A:
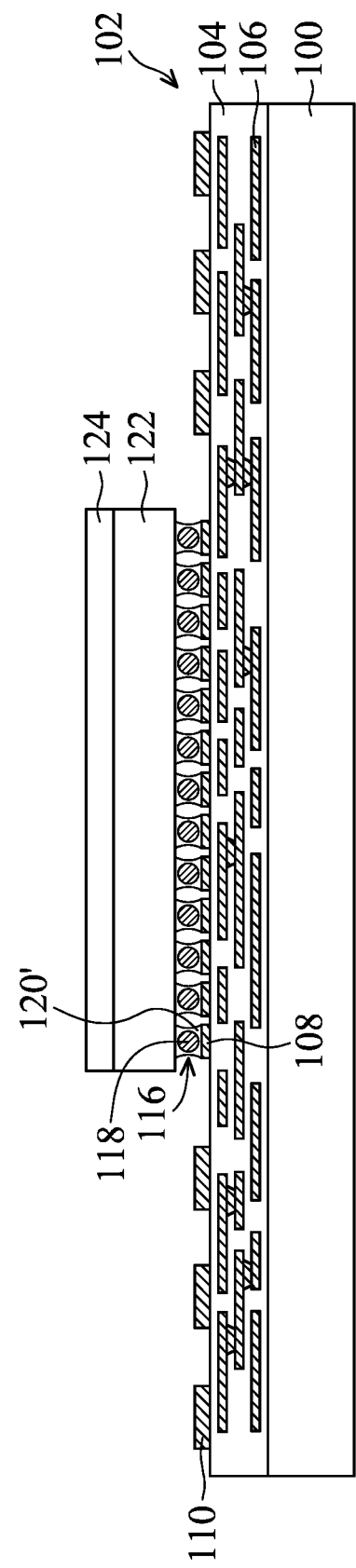
FIGS. 4A-4F are cross-sectional views of various stages of a process for forming a package structure, in accordance with some embodiments.
Figure 4B:
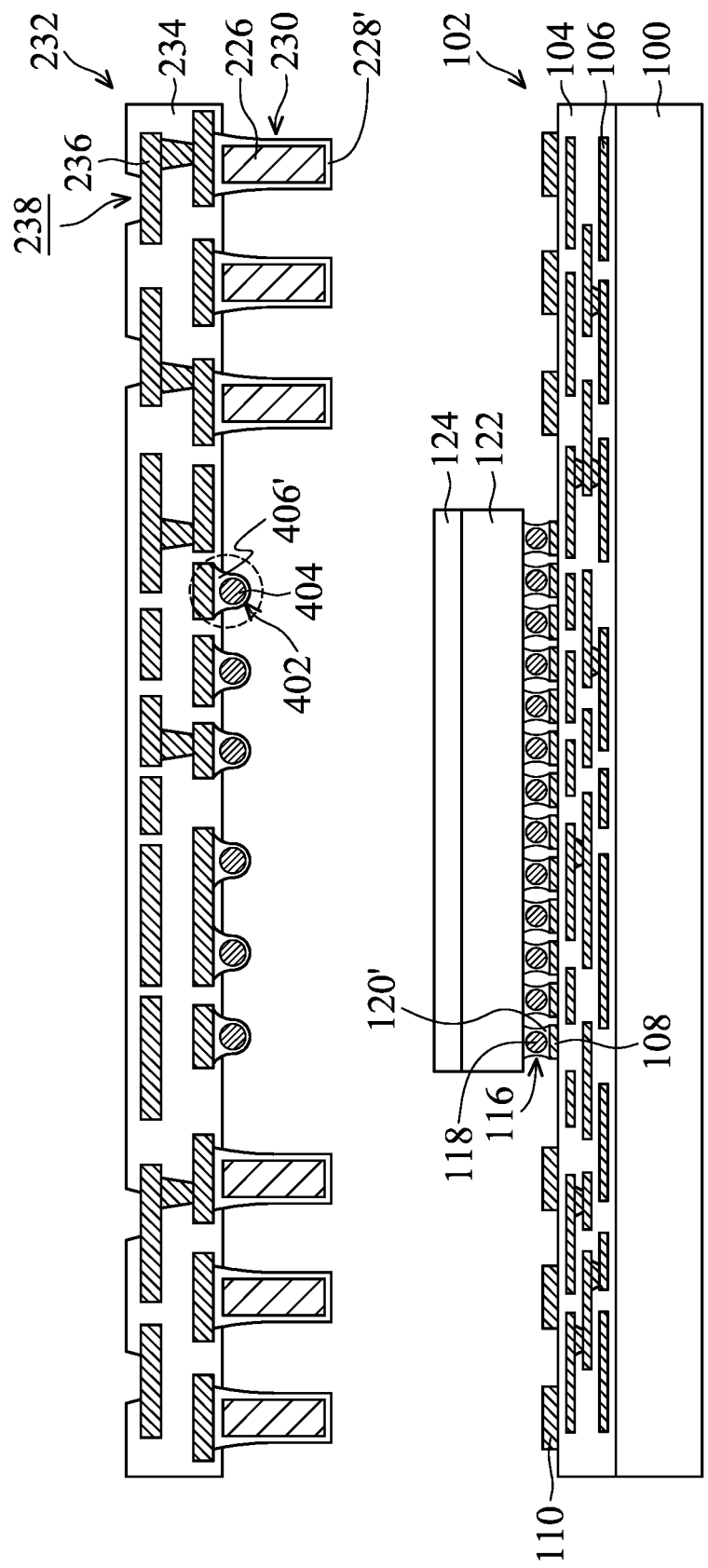

FIGS. 4A-4F are cross-sectional views of various stages of a process for forming a package structure, in accordance with some embodiments. As shown in FIG. 4A, a structure the same as or similar to that shown in FIG. 1D is formed or received, in accordance with some embodiments. Afterwards, an interposer substrate 232 with conductive features 230 formed thereon is provided or received, as shown in FIG. 4B in accordance with some embodiments. The interposer substrate 232 is positioned above the redistribution structure 102 and is ready to be bonded onto the redistribution structure 102. The conductive features 230 are substantially aligned with the conductive elements 110, as shown in FIG. 4B.

The material and formation method of the interposer substrate 232 may be the same as or similar to those of the interposer substrate 232 illustrated in FIGS. 3A-3C. In some embodiments, thermal conductive elements 402 formed over the surface of the interposer substrate 232 that faces the semiconductor die 122, as shown in FIG. 4B. In some embodiments, the thermal conductive elements 402 are conductive elements that may provide heat dissipation.

In some embodiments, similar to the conductive features 230, the thermal conductive elements 402 are placed over some of the conductive elements 236, as shown in FIG. 4B. Each of the thermal conductive elements 402 is placed onto one of the conductive elements 236. In some embodiments, the thermal conductive elements 402 are picked and placed on the conductive elements 236. In some embodiments, similar to the embodiments shown in FIG. 1B, a mask element (such as a stencil) is used to assist in the placing of the thermal conductive elements 402. In some embodiments, a flux material is applied on the conductive elements 236 before the thermal conductive elements 402 are placed. The flux material may help to attach the thermal conductive elements 402 on the conductive elements 236.

In some embodiments, similar to the conductive features 130, each of the thermal conductive elements 402 includes a support element 404 and a solder element 406', as shown in FIG. 3B. In some embodiments, the solder element 406' extends along surfaces of the support element 404. In some embodiments, the solder element 406' covers the entirety of the support element 404. The material of the support element 404 may be the same as or similar to that of the support element 118. The material of the solder element 406' may be the same or similar to that of the reflowed solder element 120'.

Figure 7:
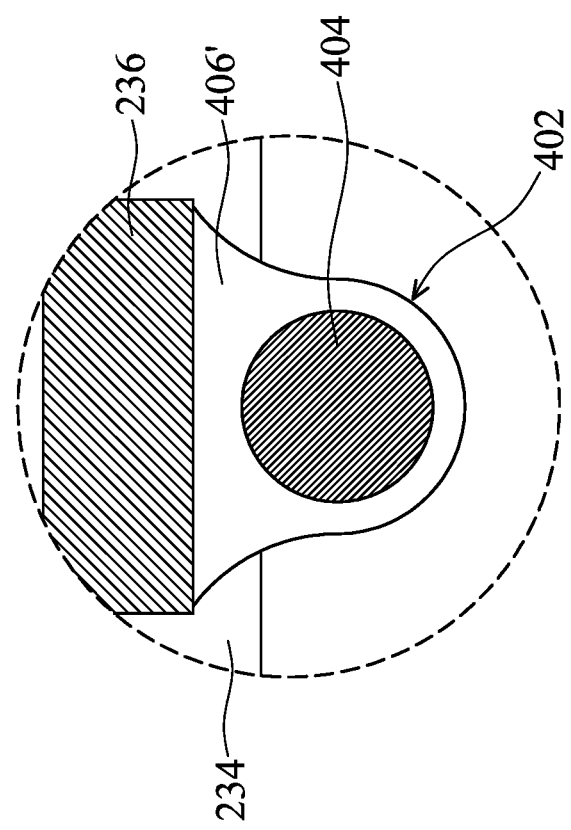
FIG. 7 is a cross-sectional view of a thermal conductive element of a package structure, in accordance with some embodiments.

In some embodiments, a thermal operation is used to reflow the thermal conductive elements 402 so as to enhance adhesion between the thermal conductive elements 402 and the conductive elements 236. FIG. 7 is a cross-sectional view of a thermal conductive element of a package structure, in accordance with some embodiments. In some embodiments, FIG. 7 is an enlarged view of one of the thermal conductive elements 402. In some embodiments, due to the thermal operation, the solder element 406' of the thermal conductive element 402 has a profile that is similar to that of the reflowed solder element 120'.

Figure 4C:
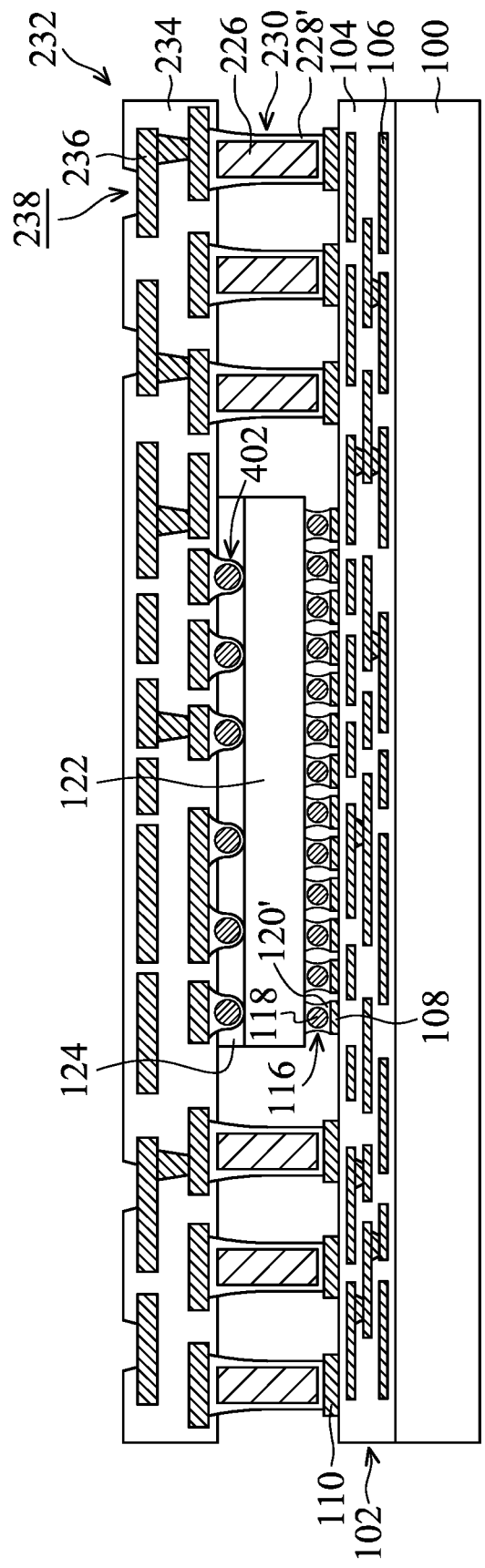

As shown in FIG. 4C, the interposer substrate 232 is stacked over the redistribution structure 102, in accordance with some embodiments. The interposer substrate 232 extends across the semiconductor die 122. In some embodiments, the interposer substrate 232 is bonded to the conductive elements 110 through the conductive features 230. In some embodiments, the interposer substrate 232 is attached onto the semiconductor die 122 through the adhesive element. The adhesive element 124 may be in direct contact with the interposer substrate 232. In some embodiments, the adhesive element 124 is a thermal conductive film. In some embodiments, the adhesive element 124 is an insulating tape with thermal conductive elements dispersed therein. The adhesive element 124 has good adhesion to the interposer substrate 232, which may also result in good thermal conductivity. The thermal conductive elements may include carbon-containing materials such as carbon nanotube, graphene, one or more other suitable materials, or a combination thereof. In some other embodiments, the adhesive element 124 is a metal-containing film that is made of or includes Ti, Cu, TiN, Al, Ni, Ag, or a combination thereof.

In some embodiments, the thermal conductive elements 402 penetrate the adhesive element 124 after the interposer substrate 232 is stacked on the redistribution structure 102, as shown in FIG. 4C. In some embodiments, the thermal conductive elements penetrate through the adhesive element 124 and are in direct contact with the semiconductor die 122. Heat generated during operation of the semiconductor die 122 may be led out through the thermal conductive elements 402 and some of the conductive elements 236 in the interposer substrate 232. Therefore, the heat may be prevented from being cumulated in the semiconductor die 122. The performance and reliability of the semiconductor die 122 are improved.

Figure 4D:
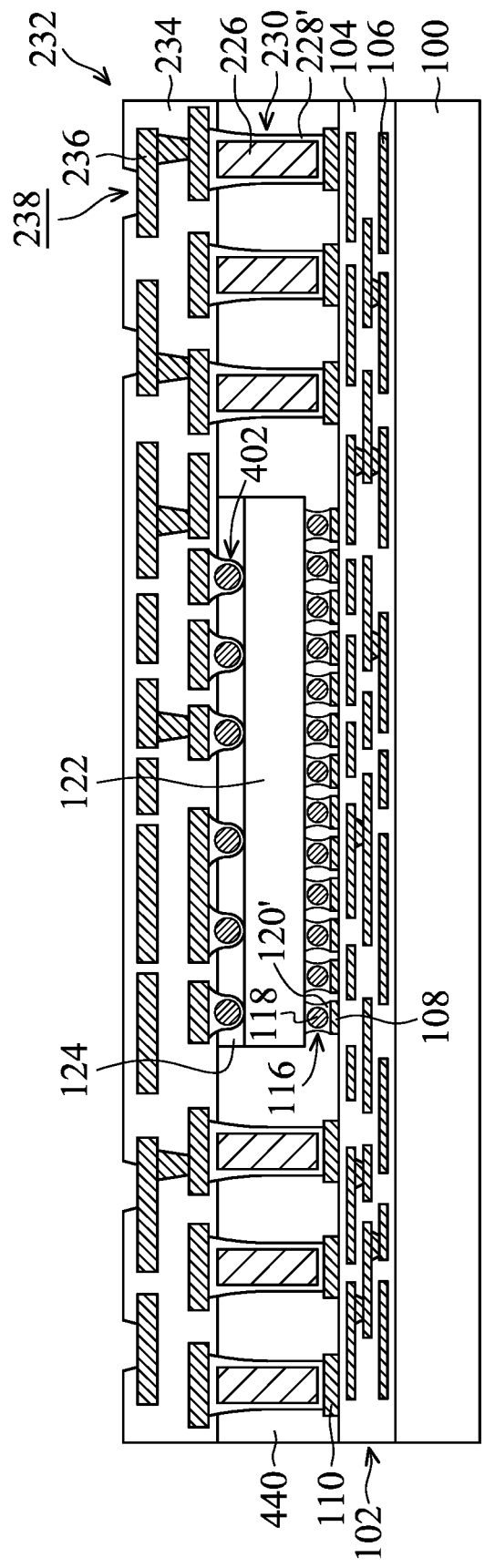

As shown in FIG. 4D, a protective layer 440 is formed to surround the conductive features 230 and the semiconductor die 122, in accordance with some embodiments. The material and formation method of the protective layer 440 may be the same as or similar to those of the protective layer 140 shown in FIG. 1H. In some embodiments, the formation of the protective layer 440 involves a thermal process.

Figure 4E:
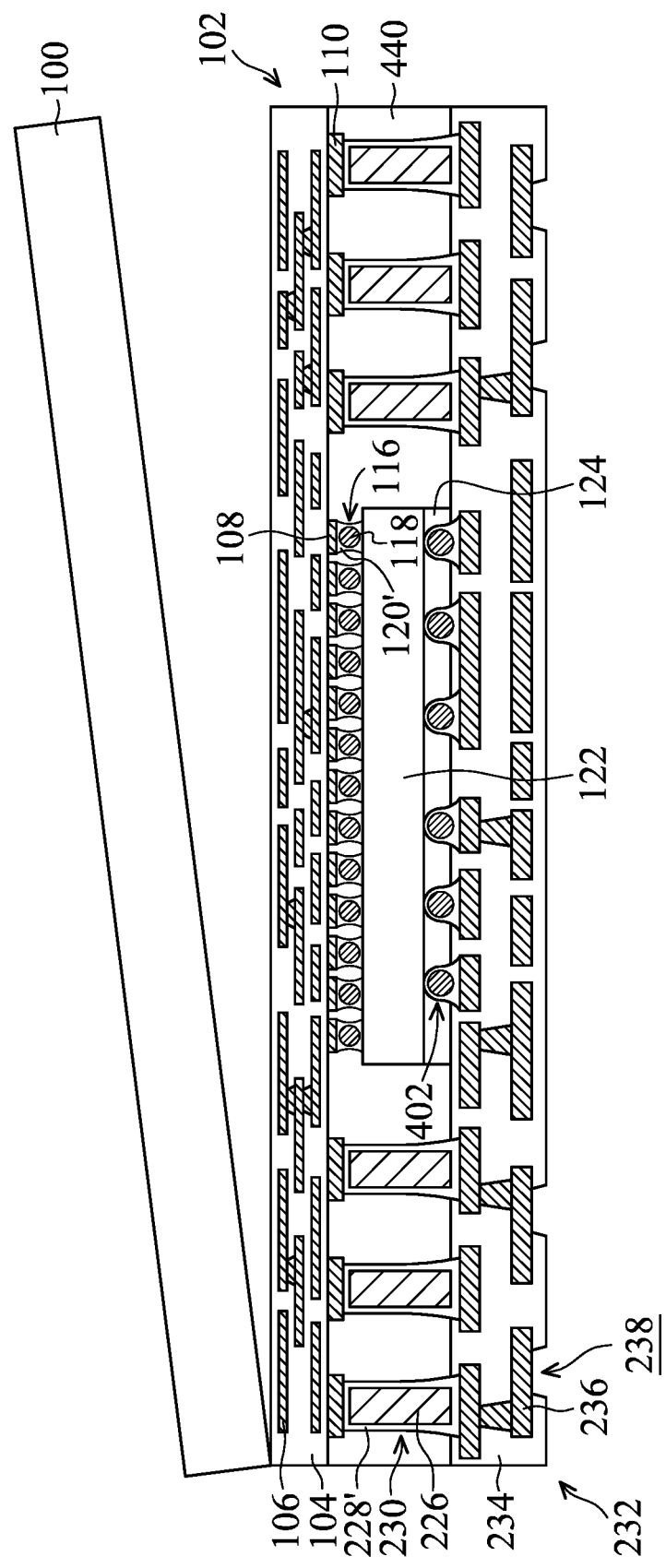

As shown in FIG. 4E, the structure shown in FIG. 4D is turned upside down, and the carrier substrate 100 is then removed, in accordance with some embodiments. In some embodiments, after the removal of the carrier substrate 100, some of the conductive features 106 are exposed.

Figure 4F:
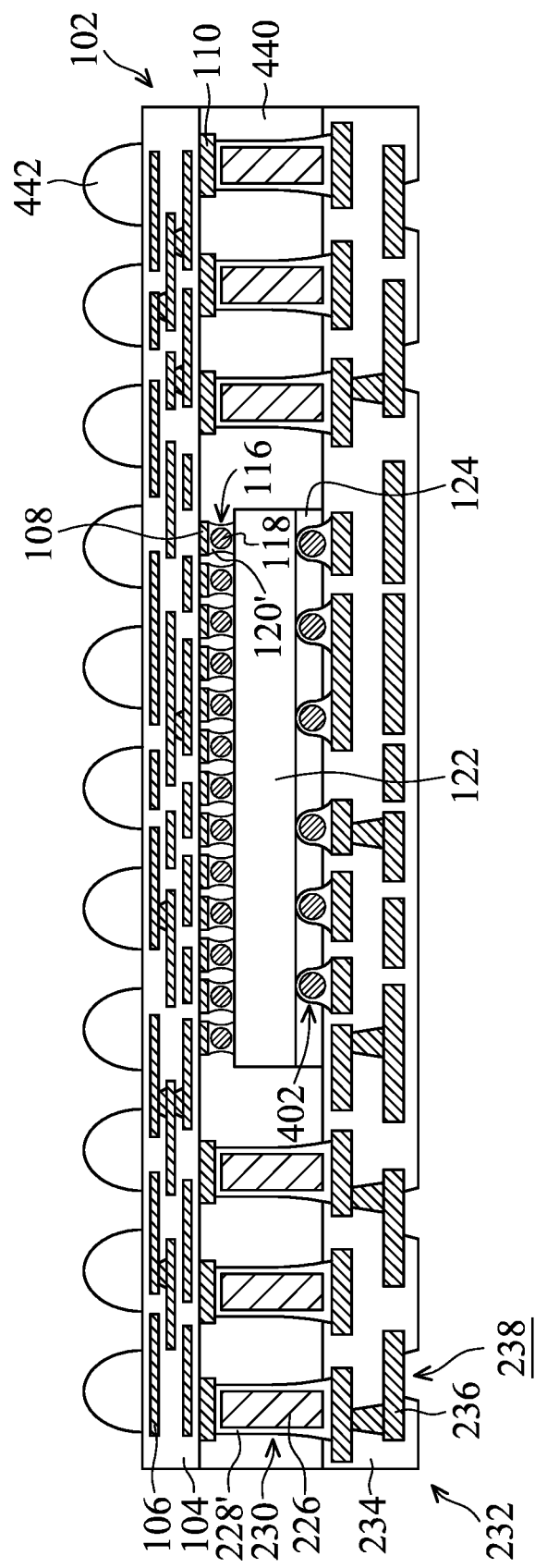

As shown in FIG. 4F, conductive bumps 442 are formed on the surface of the redistribution structure 102 that is originally covered by the carrier substrate 100, in accordance with some embodiments. The material and formation method of the conductive bumps 442 may be the same as or similar to those of the conductive bumps 142.

In some embodiments, a singulation process is then carrier out to saw through the formed structure. As a result, multiple separate package structures are formed. Afterwards, the tape carrier is removed. In FIG. 4F, one of the package structures is shown.

Many variations and/or modifications can be made to embodiments of the disclosure. In some embodiments, the conductive features have different profiles.

Figure 5A:
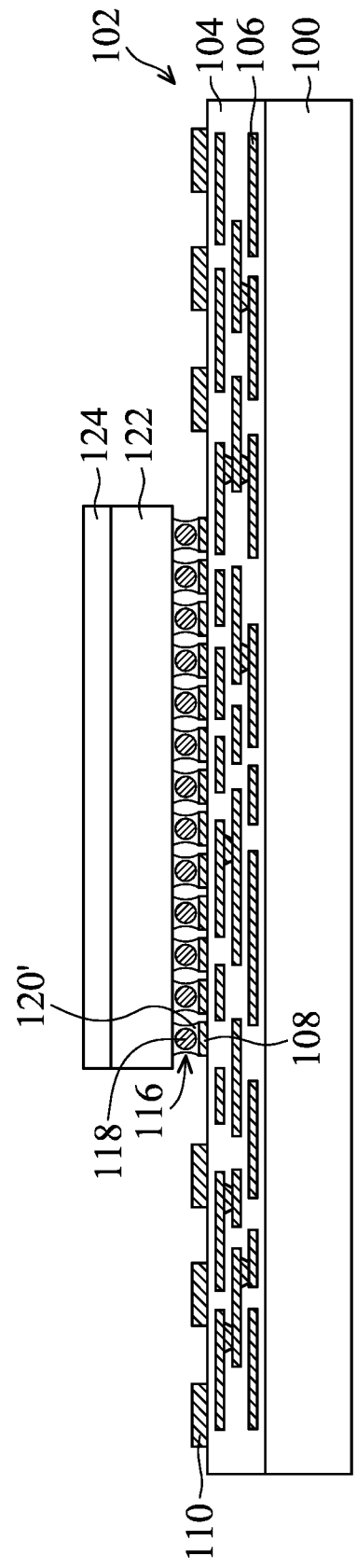
FIGS. 5A-5F are cross-sectional views of various stages of a process for forming a package structure, in accordance with some embodiments.
Figure 5B:
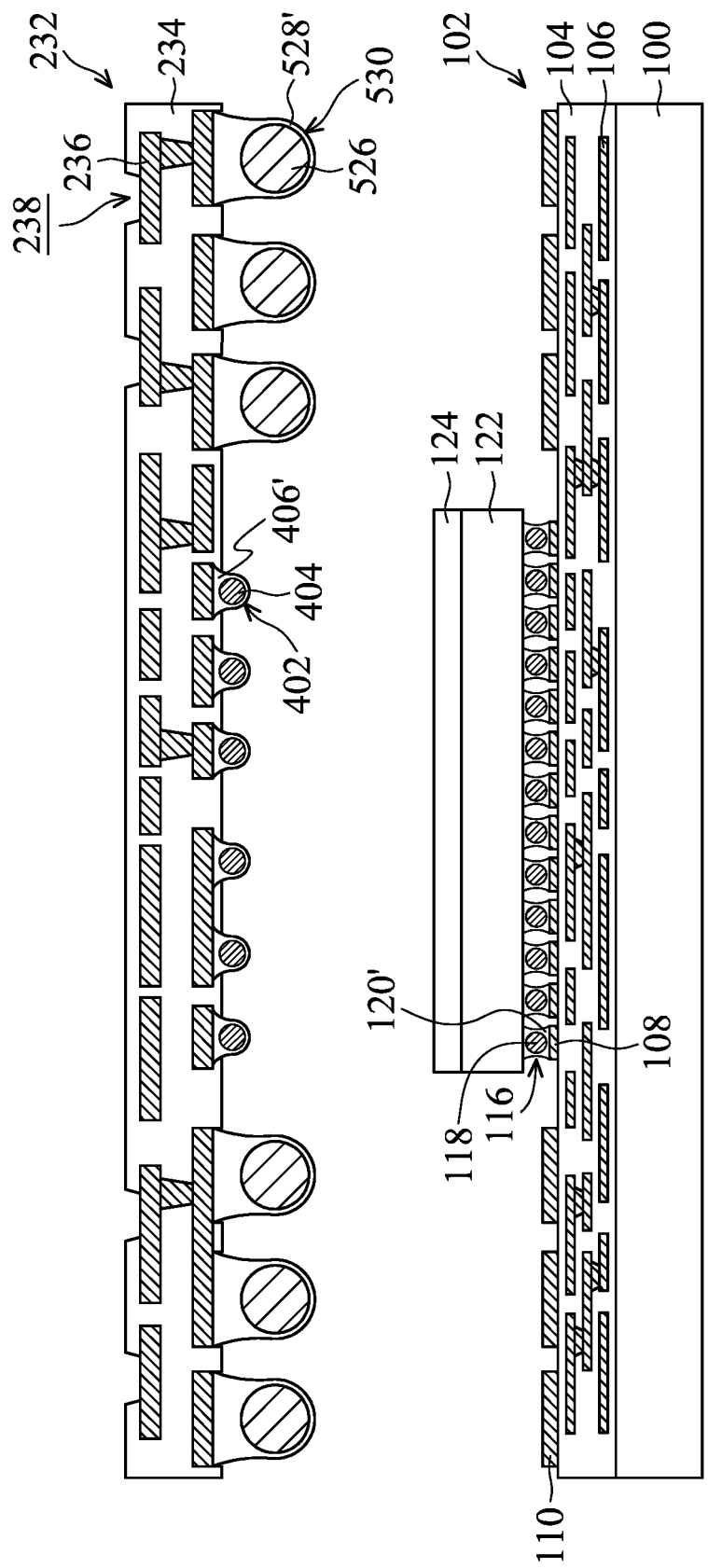

FIGS. 5A-5F are cross-sectional views of various stages of a process for forming a package structure, in accordance with some embodiments. As shown in FIG. 5A, a structure the same as or similar to that shown in FIG. 1D is formed or received, in accordance with some embodiments. Afterwards, an interposer substrate 232 with conductive features 530 and thermal conductive elements 402 formed thereon is provided or received, as shown in FIG. 4B in accordance with some embodiments. The interposer substrate 232 is positioned above the redistribution structure 102 and is ready to be bonded onto the redistribution structure 102. The conductive features 530 are substantially aligned with the conductive elements 110, as shown in FIG. 5B.

The material and formation method of the interposer substrate 232 may be the same as or similar to those of the interposer substrate 232 illustrated in FIGS. 3A-3C. In some embodiments, thermal conductive elements 402 are formed over the surface of the interposer substrate 232 that faces the semiconductor die 122, as shown in FIG. 5B. The material and formation method of the thermal conductive elements 402 in FIG. 5B may be the same as or similar to those of the thermal conductive elements 402 in FIG. 4B.

In some embodiments, similar to the conductive features 230, each of the conductive features 530 includes a support element 526 and a reflowed solder element 528'. The material and formation method of the conductive features 230 may be the same as or similar to those of the conductive features 230 illustrated in FIGS. 3A-3C. In some embodiments, the support element 526 has a different profile than the support element 226. In some embodiments, the support element 526 is a metal ball. The diameter of the metal ball may be in a range from about 100 µm to about 200 µm. The support element 526 may have a circular profile, an oval profile, or a curved profile. In some embodiments, the reflowed solder element 528' extends along surfaces of the support element 526. In some embodiments, the reflowed solder element 528' covers the entirety of the support element 526. In some embodiments, the reflowed solder element 528' has a profile that is similar to that of the reflowed solder element 120'.

Figure 5C:
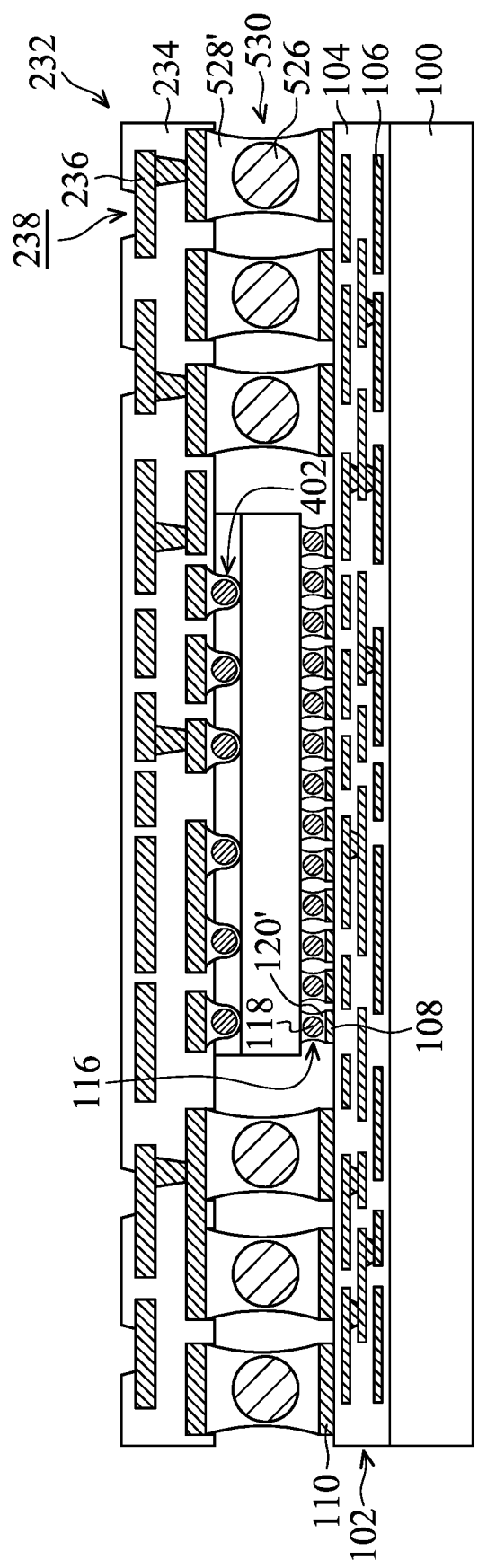

As shown in FIG. 5C, the interposer substrate 232 is stacked over the redistribution structure 102, in accordance with some embodiments. The interposer substrate 232 extends across the semiconductor die 122. In some embodiments, the interposer substrate 232 is bonded to the conductive elements 110 through the conductive features 530. In some embodiments, the interposer substrate 232 is attached onto the semiconductor die 122 through the adhesive element 124. The adhesive element 124 may be in direct contact with the interposer substrate 232. In some embodiments, the adhesive element 124 includes a die attachment film, a thermal conductive tape, or a metal-containing film.

In some embodiments, the thermal conductive elements 402 penetrate through the adhesive element 124 after the interposer substrate 232 is stacked on the redistribution structure 102, as shown in FIG. 5C. In some embodiments, the thermal conductive elements are in direct contact with the semiconductor die 122.

Figure 5D:
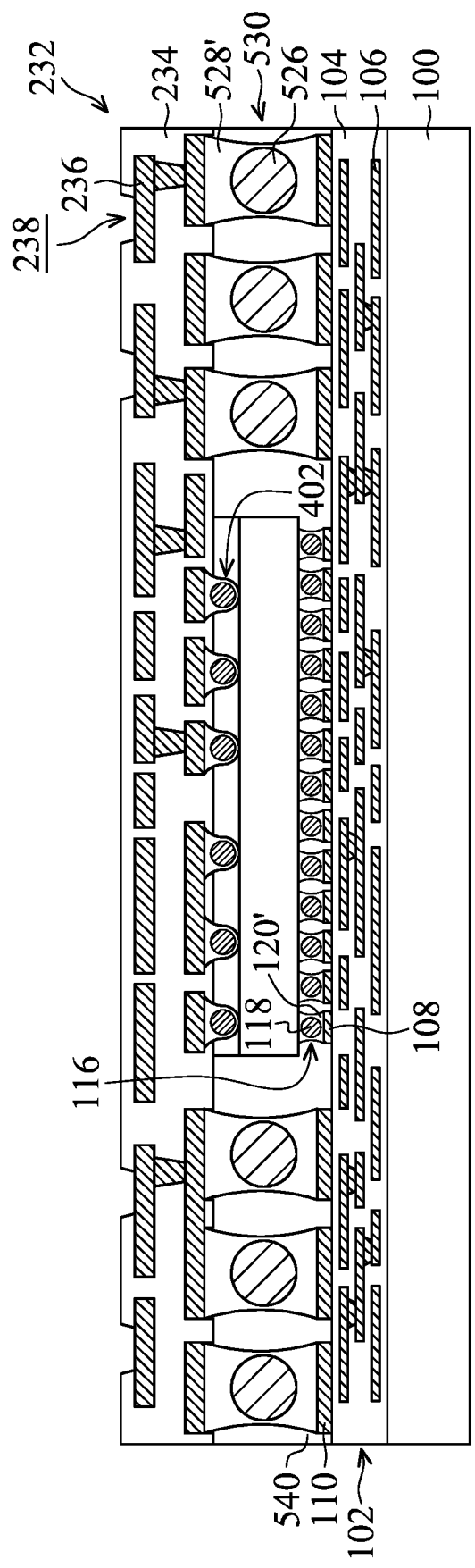

As shown in FIG. 5D, a protective layer 540 is formed to surround the conductive features 530 and the semiconductor die 122, in accordance with some embodiments. The material and formation method of the protective layer 540 may be the same as or similar to those of the protective layer 140 shown in FIG. 1H. In some embodiments, the formation of the protective layer 540 involves a thermal process. The conductive features 530 including the support elements 526 have stronger resistance to the thermal process. Warpage and/or voids are prevented or reduced.

Figure 5E:
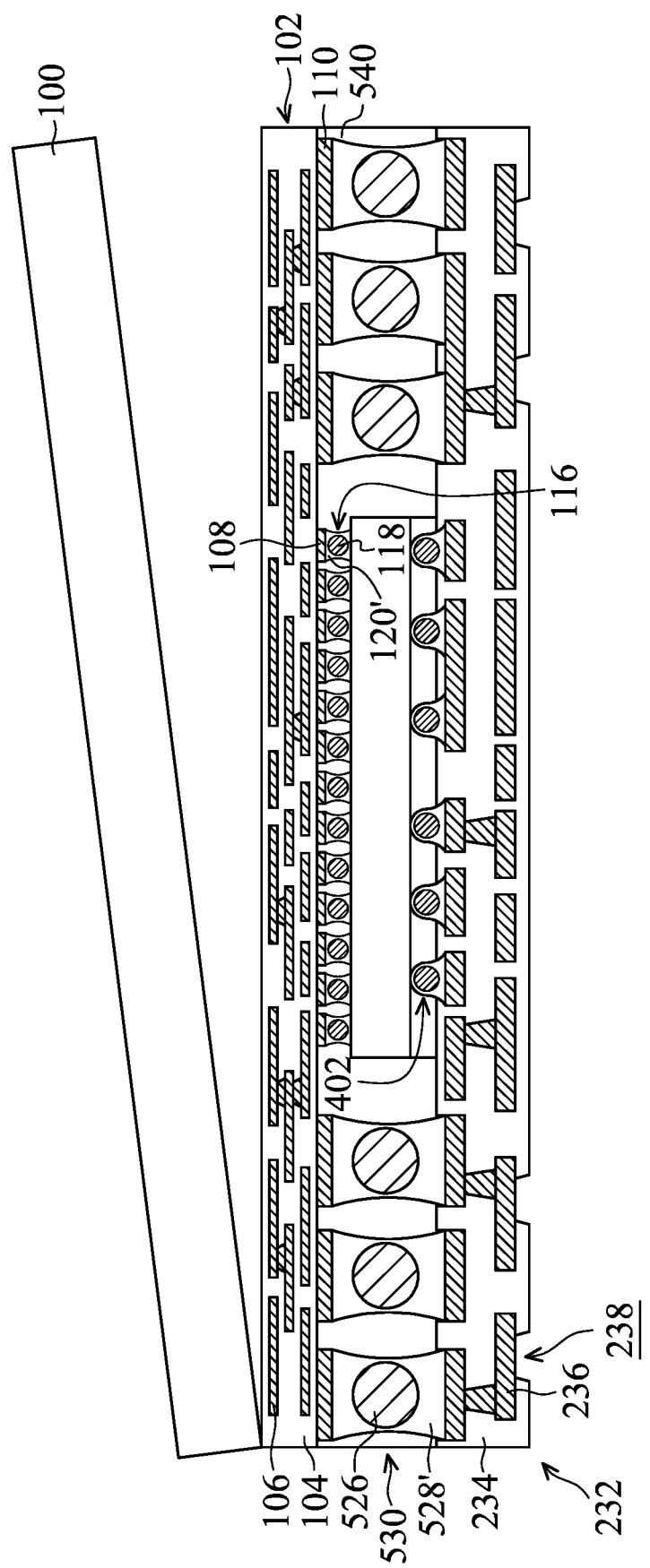

As shown in FIG. 5E, the structure shown in FIG. 5D is turned upside down, and the carrier substrate 100 is then removed, in accordance with some embodiments. In some embodiments, after the removal of the carrier substrate 100, some of the conductive features 106 are exposed.

Figure 5F:
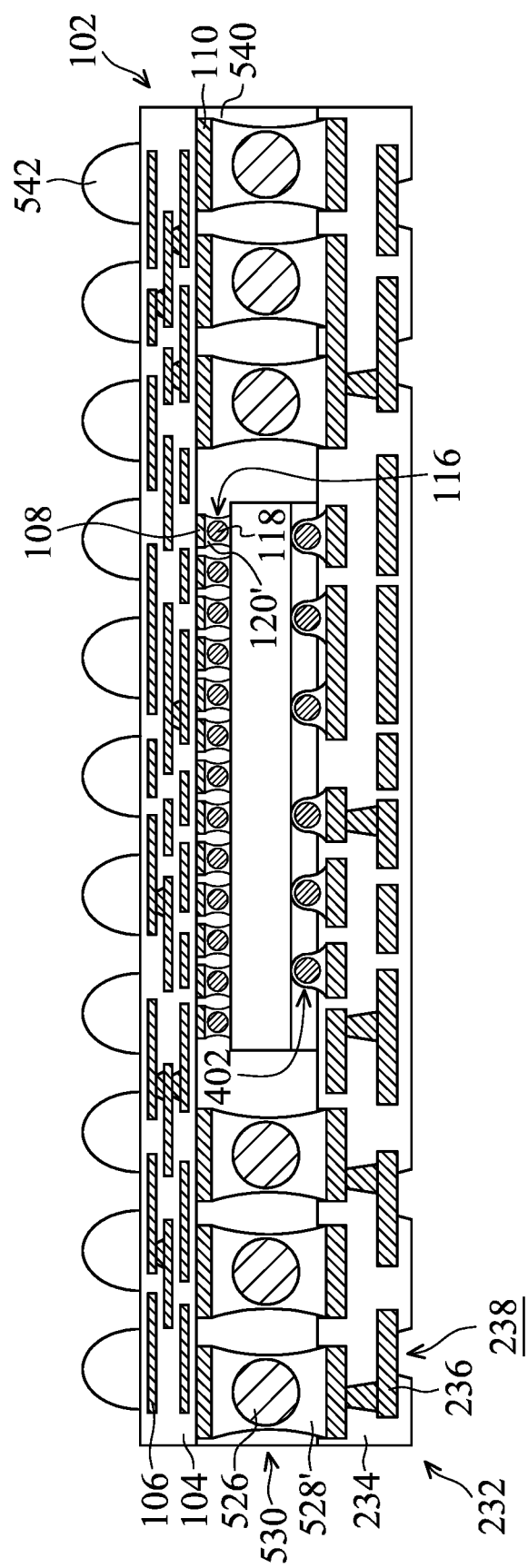

As shown in FIG. 5F, conductive bumps 542 are formed on the surface of the redistribution structure 102 that is originally covered by the carrier substrate 100, in accordance with some embodiments. The material and formation method of the conductive bumps 542 may be the same as or similar to those of the conductive bumps 142.

In some embodiments, a singulation process is then carrier out to saw through the formed structure. As a result, multiple separate package structures are formed. Afterwards, the tape carrier is removed. In FIG. 5F, one of the package structures is shown.

Embodiments of the disclosure form a package structure including a redistribution structure, an interposer substrate, and a semiconductor die between the redistribution structure and the interposer substrate. One or more conductive features are disposed between the redistribution structure and the interposer substrate. A protective layer is used to surround and protect the conductive features and the semiconductor die. Each of the conductive features includes a support element that is coated with a solder element. The support element has a greater melting point than that of the solder element. Due to the support element, the conductive features may maintain rigid during the subsequent thermal process. The distance between the interposer substrate and the redistribution structure is therefore kept substantially the same during the thermal process. The warpage of the interposer substrate and the redistribution structure is significantly reduced. Voids are also prevented from being formed between the interposer substrate and the semiconductor die and/or being formed between the interposer substrate and the protective layer. The reliability and performance of the package structure are therefore improved.

In accordance with some embodiments, a method for forming a package structure is provided. The method includes placing a semiconductor die over a redistribution structure and placing a conductive feature over the redistribution structure. The conductive feature has a support element and a solder element. The solder element extends along surfaces of the support element. The method also includes stacking an interposer substrate over the redistribution structure. The interposer substrate extends across the semiconductor die. The method further includes forming a protective layer to surround the conductive feature and the semiconductor die.

In accordance with some embodiments, a method for forming a package structure is provided. The method includes forming a protective layer to surround the conductive feature and the semiconductor die and placing a conductive feature over an interposer substrate. The conductive feature has a support element and a solder element. The solder element extends along surfaces of the support element. The method also includes stacking the interposer substrate over the redistribution structure such that the conductive feature is electrically connected to a conductive element of the redistribution structure. The method further includes forming a protective layer to surround the conductive feature and the semiconductor die.

In accordance with some embodiments, a package structure is provided. The package structure includes a redistribution structure and an interposer substrate over the redistribution structure. The package structure also includes a semiconductor die between the redistribution structure and the interposer substrate and a conductive feature between the redistribution structure and the interposer substrate. The conductive feature has a support element and a solder element. The package structure further includes a protective layer surrounding the semiconductor die and the conductive feature. The solder element separates the support element from the protective layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising: a redistribution structure; a semiconductor chip over the redistribution structure; an adhesive element over the semiconductor chip, wherein opposite outermost edges of the adhesive element are laterally between opposite outermost edges of the redistribution structure; a protective layer laterally surrounding the semiconductor chip and the adhesive element, wherein the protective layer is as wide as the redistribution structure; and a plurality of thermal conductive elements over the semiconductor chip, wherein at least two of the thermal conductive element is elements are surrounded by the adhesive element.

2. The package structure as claimed in claim 1, further comprising:
   an interposer substrate over the redistribution structure; and
   a conductive feature between the redistribution structure and the interposer substrate, wherein the conductive feature comprises a support element and a solder element, the support element comprises a metal material, and the solder element extends along a top surface, a bottom surface, and a sidewall surface of the support element.

3. The package structure as claimed in claim 2, wherein the support element has a first melting point, the solder element has a second melting point, and the first melting point is higher than the second melting point.

4. The package structure as claimed in claim 2, wherein the solder element has a first portion and a second portion, the first portion is between the second portion and the redistribution structure, and the first portion is thinner than the second portion.

5. The package structure as claimed in claim 2, wherein the adhesive element is in direct contact with the interposer substrate.

6. The package structure as claimed in claim 2, wherein the protective layer is in direct contact with the interposer substrate.

7. The package structure as claimed in claim 2, wherein each of the thermal conductive elements comprises a second support element and a second solder element, and the second solder element covers an entirety of the second support element.

8. The package structure as claimed in claim 1, wherein the protective layer is in direct contact with the adhesive element.

9. The package structure as claimed in claim 1, wherein sidewalls of the redistribution structure and the protective layer are vertically aligned with each other.

10. The package structure as claimed in claim 1, wherein the adhesive element is as wide as the semiconductor chip.

11. A package structure, comprising:
a redistribution structure;
a semiconductor chip bonded to the redistribution structure;
a first thermal conductive element and a second thermal conductive element over the semiconductor chip;
an adhesive element over the semiconductor chip, wherein opposite outermost edges of the adhesive element are laterally between opposite outermost edges of the redistribution structure, and the adhesive element laterally surrounds the first thermal conductive element and the second thermal conductive element; and
a protective layer surrounding the semiconductor chip, wherein the protective layer surrounds an interface between the adhesive element and the semiconductor chip, and opposite surfaces of the semiconductor chip are vertically between a top of the protective layer and a bottom of the protective layer.

12. The package structure as claimed in claim 11, further comprising:
an interposer substrate, wherein the semiconductor chip is between the interposer substrate and the redistribution structure, and the first thermal conductive element is between the interposer substrate and the semiconductor chip; and
a conductive feature between the redistribution structure and the interposer substrate, wherein the conductive feature comprises a support element and a solder element, and the solder element extends along a top surface, a bottom surface, and a sidewall surface of the support element.

13. The package structure as claimed in claim 12, wherein the first thermal conductive element is separated from the protective layer by the adhesive element.

14. The package structure as claimed in claim 12, wherein the first thermal conductive element comprises a second support element and a second solder element, and the second solder element covers an entirety of the second support element.

15. The package structure as claimed in claim 14, wherein the second support element is a metal ball.

16. A package structure, comprising:
a redistribution structure;
a semiconductor chip bonded to the redistribution structure;
an adhesive element over the semiconductor chip, wherein opposite outermost edges of the adhesive element are laterally between opposite outermost edges of the redistribution structure;
a protective layer surrounding the semiconductor chip, wherein the protective layer is in direct contact with the redistribution structure and a sidewall of the adhesive element;
an interposer substrate, wherein the adhesive element is between the semiconductor chip and the interposer substrate;
a conductive feature between the redistribution structure and the interposer substrate, wherein the conductive feature comprises a support element and a solder element, and the solder element extends along a top surface, a bottom surface, and a sidewall surface of the support element; and
a plurality of thermal conductive elements between the interposer substrate and the semiconductor chip, wherein the thermal conductive elements are enclosed by the adhesive element.

17. The package structure as claimed in claim 16, wherein the semiconductor chip is bonded to the redistribution structure through a plurality of tin-containing bonding structures.

18. The package structure as claimed in claim 16, wherein each of the thermal conductive elements comprises a second support element and a second solder element, and the second solder element covers an entirety of the second support element.

19. The package structure as claimed in claim 18, wherein the support element has a first melting point, the second solder element has a second melting point, and the first melting point is higher than the second melting point.

20. The package structure as claimed in claim 16, wherein the protective layer is as wide as the redistribution structure.

* * * * *